United States Patent
Yao et al.

(10) Patent No.: US 7,847,650 B2
(45) Date of Patent: Dec. 7, 2010

(54) LOW PHASE-NOISE OSCILLATOR

(75) Inventors: Chih-Wei Yao, Milpitas, CA (US); Alan Neil Willson, Jr., Pasadena, CA (US)

(73) Assignee: Pentomics, Inc, Pasadena, CA (US)

( * ) Notice: Subject to any disclaimer, the term of this patent is extended or adjusted under 35 U.S.C. 154(b) by 48 days.

(21) Appl. No.: 11/957,482

(22) Filed: Dec. 17, 2007

(65) Prior Publication Data
US 2008/0143446 A1  Jun. 19, 2008

Related U.S. Application Data

(60) Provisional application No. 60/870,350, filed on Dec. 15, 2006.

(51) Int. Cl.
*H03B 5/08* (2006.01)
*H03B 5/18* (2006.01)
(52) U.S. Cl. .................. 331/167; 331/45; 331/116; 331/117 FE; 331/117 R; 331/177 V
(58) Field of Classification Search ............ 331/45, 331/117 FE, 117 R, 177 V, 116, 167
See application file for complete search history.

(56) References Cited

U.S. PATENT DOCUMENTS

| | | | |
|---|---|---|---|
| 6,680,657 B2 * | 1/2004 | Wang et al. | 331/177 V |
| 6,850,122 B2 * | 2/2005 | Ravi et al. | 331/46 |
| 6,911,870 B2 * | 6/2005 | Gierkink et al. | 331/46 |
| 7,098,747 B2 * | 8/2006 | Anand | 331/117 FE |
| 7,511,588 B2 * | 3/2009 | Gabara | 331/117 FE |

OTHER PUBLICATIONS

E. Hegazi, J. Rael, and A. Abidi, The Designer's Guide to High-Purity Oscillators. New York: Kluwer, 2005, pp. 50-57.
A. Mirzaei and A. A. Abidi, "Analysis of oscillators locked by large injection signals: generalized . . . ," in Proc. IEEE Custom Integrated Circuits Conf., Sep. 2006, pp. 737-740.
E. Hegazi, H. Sjöland, and A. A. Abidi, "A filtering technique to lower LC oscillation phase noise," IEEE J. Solid-State Circuits, vol. 36, pp. 1921-1930, Dec. 2001.
A. A. Abidi, "High-frequency noise measurements on FET with small dimensions," IEEE Trans. Electron Devices, vol. 33, pp. 1801-1805, Nov. 1986.

(Continued)

*Primary Examiner*—Joseph Chang
*Assistant Examiner*—Richard Tan
(74) *Attorney, Agent, or Firm*—Denis Khoo

(57) ABSTRACT

A tail-tank coupling technique combines two complementary differential LC-VCOs to form a quadrature LC-VCO. The technique reduces phase noise by providing additional energy storage for noise redistribution and by cancelling noise injected by transistors when they operate in the triode region. The resulting noise factor is close to the theoretical minimum $1+\gamma$, similar to a differential LC-VCO driven by an ideal noiseless current source. However, its figure-of-merit is higher, due to the absence of voltage head-room being consumed by a current source. The optimal ratio of tail-tank capacitor to main-tank capacitor for minimizing phase noise is approximately 0.5. The method can be extended to combine any even number of LC tanks resonating at $f_o$ and $2f_o$ to form an integrated oscillator producing quadrature phase at frequency $f_{osc}$ and differential output at $2f_{osc}$.

13 Claims, 12 Drawing Sheets

OTHER PUBLICATIONS

A. Hajimiri and T. H. Lee, "A general theory of phase noise in electrical oscillators," IEEE J. Solid-State Circuits, vol. 33, pp. 179-194, Feb. 1998.

P. Andreani and A. Fard, "More on the phase noise performance of CMOS differential-pair LC-tank oscillators," IEEE J. Solid-State Circuits, vol. 41, pp. 2703-2712, Dec. 2006.

R. Bagheri, et. al., "An 800MHz to 5GHz Software-Defined Radio Receiver in 90nm CMOS", ISSCC 2006 / Session 26, Feb. 8, 2006.

R. Bagheri, et al., "An 800 MHz-6 GHz software-defined wireless receiver in 90-nm CMOS," IEEE J. Solid-State Circuits, vol. 41, pp. 2860-2876, Dec. 2006.

J. A.Weldon, et al., "A 1.75 GHz highly-integrated narrowband CMOS transmitter with . . . ," in IEEE Int. Solid-State Circuits Conf. Dig. Tech. Papers, Feb. 2001, pp. 160-161.

P. Andreani and X. Wang, "On the phase-noise and phase-error performances of multiphase LC CMOS VCOs," IEEE J. Solid-State Circuits, vol. 39, pp. 1883-1893, Nov. 2004.

M. Tiebout, "Low-power low-phase-noise differentially tuned quadrature VCO design in standard CMOS," IEEE J. Solid-State Circuits, vol. 36, pp. 1018-1024, Jul. 2001.

T. P. Liu, "A 6.5 GHz monolithic CMOS voltage-controlled oscillator," in IEEE Int. Solid-State Circuits Conf. Dig. Tech. Papers, Feb. 1999, pp. 404-405.

J. E. Rogers and J. R. Long, "A 10-Gb/s CDR/DEMUX with LC delay line VCO in 0.18- m CMOS," in IEEE Int. Solid-State Circuits Conf. Dig. Tech. Papers,Feb. 2002, pp. 254-255.

J. Lee and B. Razavi, "A 40-Gb/s clock and data recovery circuit in 0.18- m CMOS technology," IEEE J. Solid-State Circuits, vol. 38, pp. 2181-2190, Dec. 2003.

S. L. J. Gierkink, et al., "A low-phase-noise 5-GHz CMOS quadrature VCO using superharmonic coupling," IEEE J. Solid-State Circuits, vol. 38, pp. 1148-1154, Jul. 2003.

A. Ravi, et al., "An optimally transformer coupled, 5 GHz quadrature VCO in a 0.18- m digital CMOS process," in Dig. IEEE Symp. VLSI Circuits, Jun. 2003, pp. 141-144.

C. Yao and A. Willson, "A phase-noise reduction technique for quadrature LC-VCO . . . ," in IEEE Int. Solid-State Circuits Conf. Dig. Tech. Papers, Feb. 2006, pp. 196-197.

* cited by examiner

LOW PHASE-NOISE OSCILLATOR

This application claims the benefit of and priority of U.S. Provisional Patent Application Ser. No. 60/870,350, entitled "Low Phase-Noise Quadrature Phase Oscillator" by Chih-Wei Yao and Alan N. Willson, Jr., filed on Dec. 15, 2006.

BACKGROUND OF THE INVENTION

1. Field of the Invention

The present invention relates generally to an oscillator, and more particularly, to a low phase-noise oscillator.

2. Description of the Related Art

Quadrature phase clock generation finds applications in many communication systems. For RF front-ends, quadrature phase is required for image rejection receivers and for down-converting RF/IF signals to baseband. For high speed clock and data recovery (CDR) systems, quadrature phase is required for half-rate phase detection, phase-interpolation, and frequency detection.

One of three approaches can be adopted to generate quadrature phase: First, a quadrature VCO (QVCO) can be used. Second, a divide-by-two circuit can generate quadrature phases if a VCO runs at twice the required frequency. Third, a polyphase filter can be employed to generate the 90° phase shift at the cost of increased power dissipation and sensitivity to component mismatches. For RF front-ends, direct-conversion or zero-IF is currently the dominating architecture for integrated solutions. A direct conversion transceiver will often avoid QVCO to prevent LO pulling. However, two emerging trends in RF design make QVCO a preferred alternative to conventional approaches. For software-defined radio transceivers as described in R. Bagheri, et al., "An 800 MHz-6 GHz software-defined wireless receiver in 90-nm CMOS," IEEE J. Solid-State Circuits, vol. 41, pp. 2860-2876, December 2006, which is incorporated herein by reference, both the receive down-conversion and transmit up-conversion harmonic-rejection mixers, as described in J. A. Weldon, et al., "A 1.75 GHz highly-integrated narrowband CMOS transmitter with harmonic-rejection mixers," in IEEE Int. Solid-State Circuits Conf. Dig. Tech. Papers, February 2001, pp. 160-161, which is incorporated herein by reference, require eight clock phases, which can be derived from QVCO output using a divide-by-2 circuit. For an ultra-wideband (UWB) transmitter, QVCO can drive a direct conversion transmitter because LO pulling is not an issue with UWB signaling.

A number of quadrature LC oscillators have been reported as described in the following: P. Andreani and X. Wang, "On the phase-noise and phase-error performances of multiphase LC CMOS VCOs," IEEE J. Solid-State Circuits, vol. 39, pp. 1883-1893, November 2004; M. Tiebout, "Low-power low-phase-noise differentially tuned quadrature VCO design in standard CMOS," IEEE J. Solid-State Circuits, vol. 36, pp. 1018-1024, July 2001; T. P. Liu, "A 6.5 GHz monolithic CMOS voltage-controlled oscillator," in IEEE Int. Solid-State Circuits Conf. Dig. Tech. Papers, February 1999, pp. 404-405; J. E. Rogers and J. R. Long, "A 10-Gb/s CDR/DEMUX with LC delay line VCO in 0.18-μm CMOS," in IEEE Int. Solid-State Circuits Conf. Dig. Tech. Papers, February 2002, pp. 254-255; J. Lee and B. Razavi, "A 40-Gb/s clock and data recovery circuit in 0.18-μm CMOS technology," IEEE J. Solid-State Circuits, vol. 38, pp. 2181-2190, December 2003; S. L. J. Gierkink, et al., "A low-phase-noise 5-GHz CMOS quadrature VCO using superharmonic coupling," IEEE J. Solid-State Circuits, vol. 38, pp. 1148-1154, July 2003; and A. Ravi, et al., "An optimally transformer coupled, 5 GHz quadrature VCO in a 0.18-μm digital CMOS process," in Dig. IEEE Symp. VLSI Circuits, June 2003, pp. 141-144, all of which are incorporated herein by reference. Coupled oscillators, as described in aforementioned references P. Andreani and X. Wang, "On the phase-noise and phase-error performances of multiphase LC CMOS VCOs," M. Tiebout, "Low-power low-phase-noise differentially tuned quadrature VCO design in standard CMOS," and T. P. Liu, "A 6.5 GHz monolithic CMOS voltage-controlled oscillator," operate away from the resonance frequency of the tanks so as to create the required phase shift, thus providing a trade-off between reliability of oscillation and the phase noise as described in T. P. Liu, "A 6.5 GHz monolithic CMOS voltage-controlled oscillator." In addition, they have two stable states at two different oscillation frequencies. An oscillator can lock into either one of the two stable states during power-up, resulting in unpredictable oscillation frequencies and I/Q ±90° phase ambiguity.

The multi-phase oscillator, as described in J. E. Rogers and J. R. Long, "A 10-Gb/s CDR/DEMUX with LC delay line VCO in 0.18-μm CMOS," drives transmission lines by gain stages loaded by resistors, resulting in additional energy loss in each cycle and thus, higher phase noise. A multi-phase circular LC delay line oscillator as described in J. Lee and B. Razavi, "A 40-Gb/s clock and data recovery circuit in 0.18-μm CMOS technology," requires relatively small total capacitance, which would result in higher available noise power (proportional to kT/C). Superharmonic-coupled QVCO as described in S. L. J. Gierkink, et al., "A low-phase-noise 5-GHz CMOS quadrature VCO using superharmonic coupling" and A. Ravi, et al., "An optimally transformer coupled, 5 GHz quadrature VCO in a 0.18-μm digital CMOS process," are free from the performance/reliability trade-offs and bimodal oscillation problems associated with coupled QVCO. A transformer is employed in S. L. J. Gierkink, et al., "A low-phase-noise 5-GHz CMOS quadrature VCO using superharmonic coupling" to couple the tail nodes of two differential VCOs together. A. Ravi, et al., "An optimally transformer coupled, 5 GHz quadrature VCO in a 0.18-μm digital CMOS process" cross-couples the current-control transistors at tail nodes. Neither approach, however, is particularly effective in reducing phase noise.

The application of the noise filtering technique as described in E. Hegazi, J. Rael, and A. Abidi, "The Designer's Guide to High-Purity Oscillators", New York: Kluwer, 2005, pp. 50-57 and E. Hegazi, H. Sjöland, and A. A. Abidi, "A filtering technique to lower LC oscillation phase noise," IEEE J. Solid-State Circuits, vol. 36, pp. 1921-1930, December 2001, both of which are incorporated by reference herein, in a differential form is briefly mentioned in S. L. J. Gierkink, et al., "A low-phase-noise 5-GHz CMOS quadrature VCO using superharmonic coupling." The circuit is shown in FIG. 1. The capacitor 101 that is intended to sink current source noise in the noise filtering technique must be removed in order to prevent the oscillator from generating two, instead of four phases. Thus, the thermal noise produced by the current source contributes to the phase noise and causes an increase in the noise factor. In addition, the noise filtering technique imposes a need for high impedance values looking into the tail nodes at twice the oscillation frequency. As a result, a large inductance and a small capacitance value would be chosen. Such a design decision would cause two problems: First, there would be a significant amount of I/Q mismatch due to the presence of a capacitance mismatch between the two copies of differential VCOs. Capacitance mismatch is inevitable, due to variations in the manufacturing process. Second, it would limit the noise distribution between the two copies of differential VCOs, and the benefit of a 3-dB phase noise reduction by combining two copies of VCOs cannot be fully realized. Furthermore, the voltage headroom consumed by the current source will result in a lower figure-of-merit than that of the proposed method.

The proposed circuit contains no current source. According to the conventional understanding of LC-VCO, this oscillator would appear to operate in the voltage-limited region, which would have a lower figure-of-merit. This is not the case, however, because the increased current consumption will cause a higher amplitude in the tail tank waveform, causing the transistor $V_{gs}$ to drop. Thus, a negative feedback mechanism works to limit the current consumption. As a result, the proposed circuit never operates in the voltage-limited region. Transistors can be sized much larger to reduce I/Q mismatch without causing a drop in its figure-of-merit as would be the case for conventional oscillators without a current source.

SUMMARY OF THE INVENTION

A new quadrature-phase oscillator achieving a noise factor close to the theoretical minimum value of 1+γ is presented. The tail tanks serve dual purposes in phase noise reduction. First, they provide additional energy storage to force noise current redistribution and, as a result, the noise current injected into the main tank is reduced. Second, they provide a noise canceling mechanism to reduce the impact of injected noise when a transistor is operating in the triode region. The tail tank causes a built-in negative feedback mechanism to limit the current consumption in this oscillator. As a result, the figure-of-merit doesn't drop with the increase of transistor size as it would in a conventional oscillator. Therefore, transistors can be sized large to reduce I/Q mismatch. The optimum ratio between the tail and main tank capacitors is 0.5 for a minimum noise factor. To a first order, this optimum ratio is independent of transistor sizing. To reduce the layout area, the inductors connecting to $V_{dd}$ and Gnd can be replaced by bonding wires if a single-turn spiral inductor is employed. If multi-turn spiral inductors are used, these $V_{dd}$- and Gnd-connected inductors are not required since there is a built-in negative inductance. This oscillator also provides differential output at twice the oscillation frequency as an added benefit. Furthermore, the proposed method can also be expanded into a multi-way oscillator that provides quadrature-phase clock distribution throughout the chip that is immune to propagation delay.

In this work (a condensed version of which appears in C. Yao and A. Willson, "A phase-noise reduction technique for quadrature LC-VCO with phase-to-amplitude noise conversion," in IEEE Int. Solid-State Circuits Conf. Dig. Tech. Papers, February 2006, pp. 196-197, which is incorporated by reference herein) we present a tail-tank coupling technique that combines two complementary differential oscillators to form a quadrature oscillator. Similar to a differential LC-VCO driven by an ideal current source, the proposed QVCO also has a noise factor close to the theoretical minimum of 1+γ (E. Hegazi, J. Rael, and A. Abidi, "The Designer's Guide to High-Purity Oscillators") but it has a higher figure-of-merit (FOM) due to the absence of voltage head-room being consumed by the current source.

BRIEF DESCRIPTION OF THE DRAWINGS

A more complete appreciation of the invention and many of the advantages thereof will be readily obtained as the same becomes better understood by reference to the detailed description when considered in connection with the accompanying drawings, wherein.

DETAILED DESCRIPTION

Quadrature-Phase LC-VCO Circuit

Figure 1:
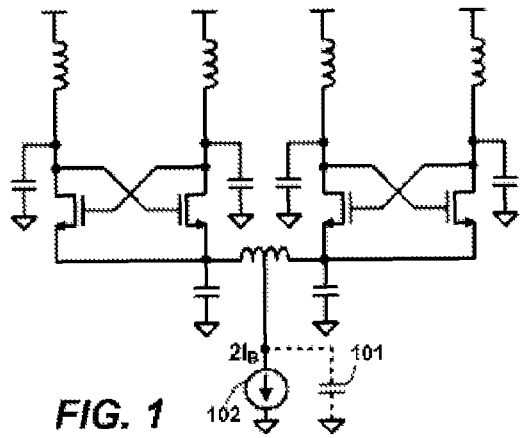
FIG. 1 is a prior art block diagram view applying the noise filtering technique in the differential form to generate quadrature phase.
Figure 2:
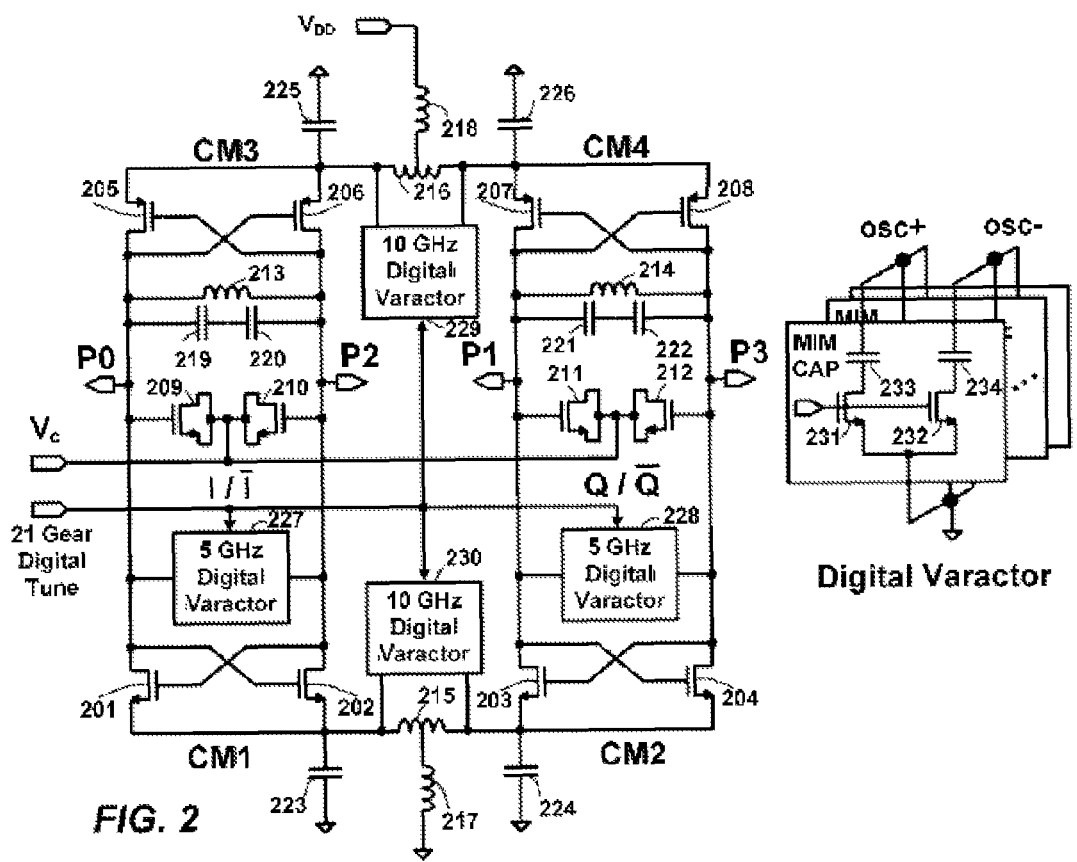
FIG. 2 is a circuit diagram of the proposed quadrature-phase oscillator.
Figure 3:
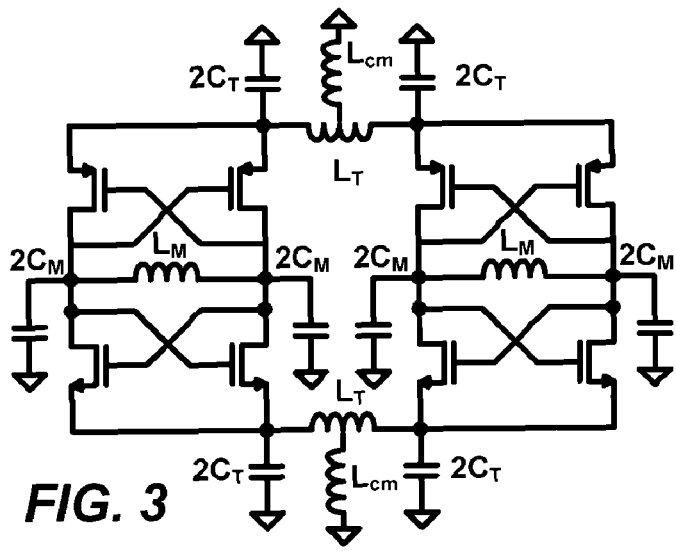
FIG. 3 is a simplified circuit model for the proposed quadrature-phase oscillator.

The proposed QVCO utilizing tail-tank coupling is shown in FIG. 2, and its equivalent model for analysis is shown in FIG. 3. Two copies of complementary LC-VCOs are combined together at NMOS and PMOS tail nodes by two separate LC tanks. Whenever a transistor in a cross-coupled pair enters the triode region, the tail node waveform is forced to follow the main tank waveform. Two transistors in a cross-coupled pair take turns operating in the deep-triode region, and thus, oscillation waveforms at frequency $2f_o$ are created at the tail nodes. There are two possible modes of oscillation: The two complementary LC-VCOs can either oscillate in unison to produce the same output phases or they can produce quadrature output phases as described in A. Mirzaei and A. A. Abidi, "Analysis of oscillators locked by large injection signals: generalized Adler's equation and geometrical interpretation," in Proc. IEEE Custom Integrated Circuits Conf., September 2006, pp. 737-740, which is incorporated by reference herein. The quadrature mode is desired and the unison mode is undesired. The circuit needs to be properly designed to make the unison mode unstable.

Assume that the oscillator is operating in the unison mode and produces only two output phases, and the noise current produced by transistors and resistors is injected into the system to disturb the oscillation. The injected noise current would cause a certain differential amplitude to appear at the tail tanks. Since the cross-coupled transistors take turns operating in the deep triode region, some of the energy stored in the tail tank is transferred to the main tanks to cause opposite phase shift in the two main tanks. Due to inductors 217 and 218, the oscillator can support a progressively larger oscillation amplitude as it moves away from the unison mode toward the quadrature mode. The underlying mechanism is explained in more detail in the paragraph that follows. As a result of this mechanism, a small deviation from unison mode would cause an increased amplitude in the main tank waveforms, which would then cause an increased differential amplitude in the tail tank waveforms. This would result in a further increase in the amplitude of main tank waveforms. Thus, a positive feedback mechanism is triggered to move the operation away from the undesired unison mode toward the desired quadrature mode.

Figure 4:
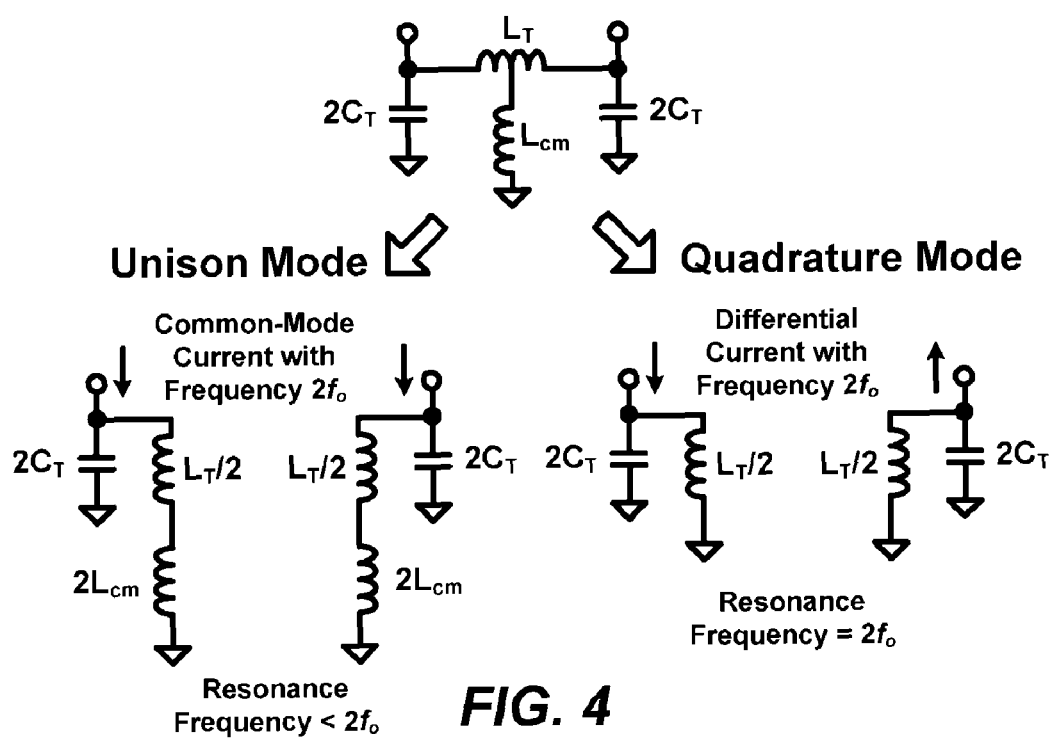
FIG. 4 is a diagram view to explain the impedance experienced at the tail tank for the two possible modes of oscillation.

The function of inductors 217 and 218 is described as follows: In the unison mode, the super-harmonic current at frequency $2f_o$ appears as a common mode current to the tail tanks. In the quadrature mode, the super-harmonic current appears as a differential current to the tail tanks. FIG. 4 shows equivalent tail tank models for super-harmonic current injected in the unison mode and in the quadrature mode. The resonance frequency of the differential mode is designed to be $2f_o$. However, for the common mode, the inductance $L_{cm}$ forces a lower resonance frequency. Thus, the super-harmonic current in the unison mode would experience a much lower tank impedance, which results in a lower oscillation amplitude in comparison to the quadrature mode. Since the main and tail tank waveforms track each other when transistors operate in the triode region, the amplitude of both the main and tail tank waveforms are increased in the quadrature mode. If single-turn spiral inductors are employed for tail tank inductors 215 and 216, then 215 and 216 only need to be larger than half of the tail tank inductances. If multi-turn inductors are employed for 215 and 216, the inductive coupling provides a negative $L_{cm}$, making the resonance frequency higher in the common-mode than in the differential-mode. Similar to the previously described case, the super-harmonic current would experience a much higher tank impedance in the quadrature mode than in the unison mode, and thus, 217 and 218 are not required.

There is one additional requirement to ensure correct operation: There must be a low-loss and low-delay path to communicate the waveforms between the main and tail tanks. Whenever cross-coupled transistors enter the deep-triode region, $R_{on}$ together with capacitances $2C_M$ and $2C_T$ form an RC delay path. If there is too much delay, the tail tank and main tank waveforms cannot be communicated effectively, and the circuit will lock to the unison mode. For correct operation, the following conditions need to be satisfied:

$$\frac{1}{2\pi R_{on}(V_{gs} = V_{dd})(2C_T)} > 2f_o$$

$$\frac{1}{2\pi R_{on}(V_{gs} = V_{dd})(2C_M)} > 2f_o.$$

Figure 5:
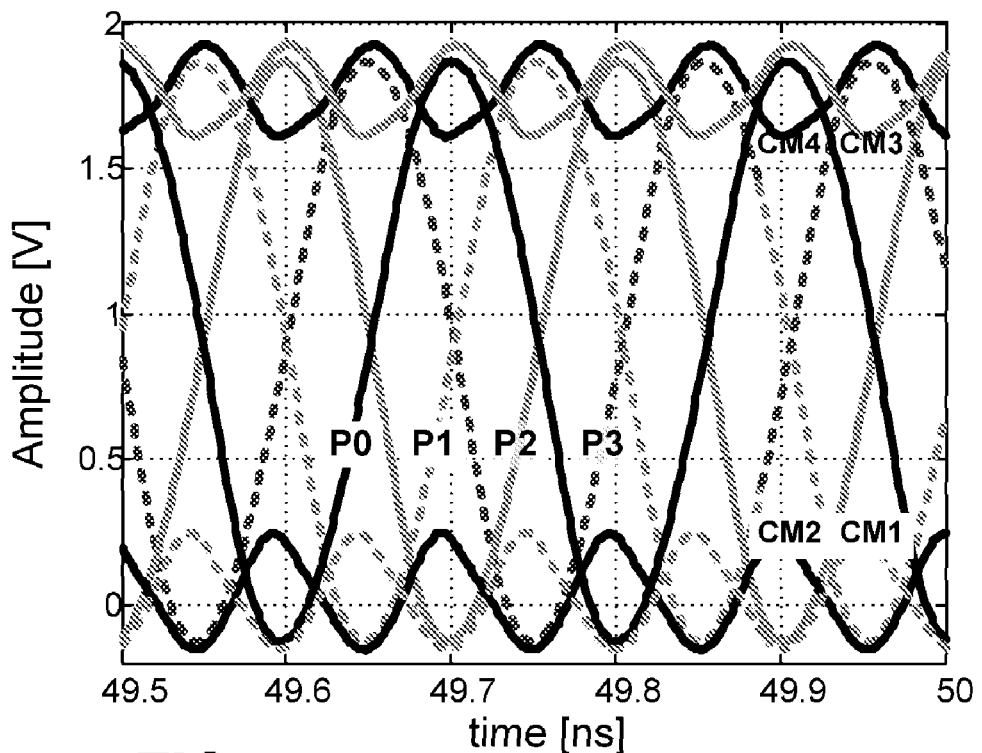
FIG. 5 is the oscillation waveform produced by a circuit simulator.

When the circuit operates in the desired quadrature mode, an anti-phase relationship is forced at tail nodes CM1/CM2 and CM3/CM4 to yield 180° phase shift at the frequency of the tail node waveforms $2f_o$ or, equivalently, a 90° phase shift for the main tank waveforms at frequency $f_o$. The oscillation waveform is shown in FIG. 5.

Figure 6:
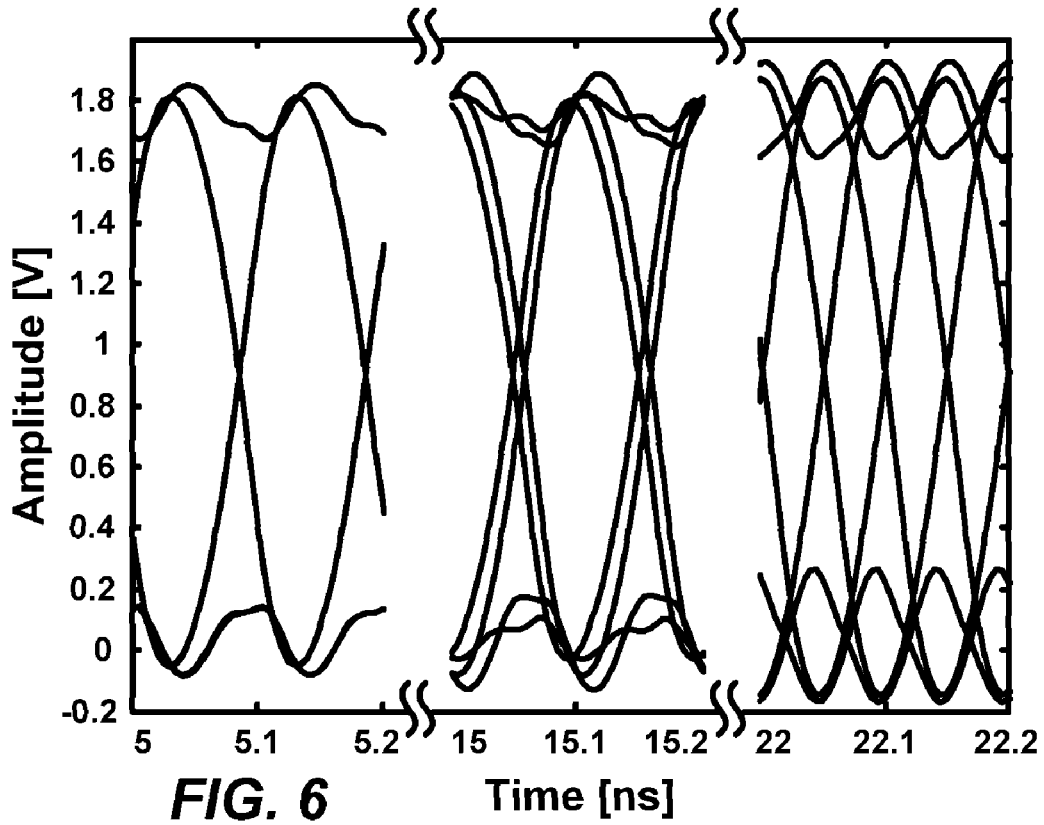
FIG. 6 is the oscillation waveform for the operating mode simulation with an impulse current injected at 5 ns.

The circuit start-up operation, described earlier, can be verified by transient circuit simulation. If a small impulse current is injected, the simulator must run with sufficiently high precision and small enough time step; otherwise, the simulation may lock incorrectly to the unison mode. FIG. 6 shows the operating mode simulation result.

Digital capacitor banks 227, 228, 229, 230 are used in the main and tail tanks to improve frequency tracking across the entire tuning range. Fine-tune varactors 209, 210, 211, 212 are used only in the main tanks.

The proposed circuit could also be envisioned as a way to couple two complementary differential LC-VCOs using the noise filtering technique as described in E. Hegazi, J. Rael, and A. Abidi, "The Designer's Guide to High-Purity Oscillators" and E. Hegazi, H. Sjöland, and A. A. Abidi, "A filtering technique to lower LC oscillation phase noise." However, the intuitive understanding provided by the given references would lead to a design that maximizes the tail tank resistance, resulting in a small tail-tank capacitor. It is demonstrated in later sections of in this document that a relatively large $C_T$ is required for low I/Q mismatch. In addition, large transistor sizes are required to ensure both quadrature mode operation and low I/Q mismatch. Due to these requirements, the noise filtering technique cannot provide a full and satisfactory explanation of the performance of the proposed circuit. The super-harmonic current at frequency $2f_o$ is not fully rejected by the tail tanks as described in E. Hegazi, J. Rael, and A. Abidi, "The Designer's Guide to High-Purity Oscillators" and E. Hegazi, H. Sjöland, and A. A. Abidi, "A filtering technique to lower LC oscillation phase noise." Instead, a portion of the current is stored in the tail tanks, and it increases the amplitude of the tail tank waveforms. As demonstrated in later sections of this document, due to the relatively large transistor sizing, a minimum noise factor can only be achieved when the $C_T/C_M$ ratio is close to 0.5.

When the tail tank capacitance is larger than 80% of the main tank's capacitance, the circuit cannot sustain the required positive feedback to drive the oscillation to quadrature mode, and the circuit would lock to the unison mode.

Start-up Circuit to Prevent I/Q Phase Ambiguity

Figure 7:
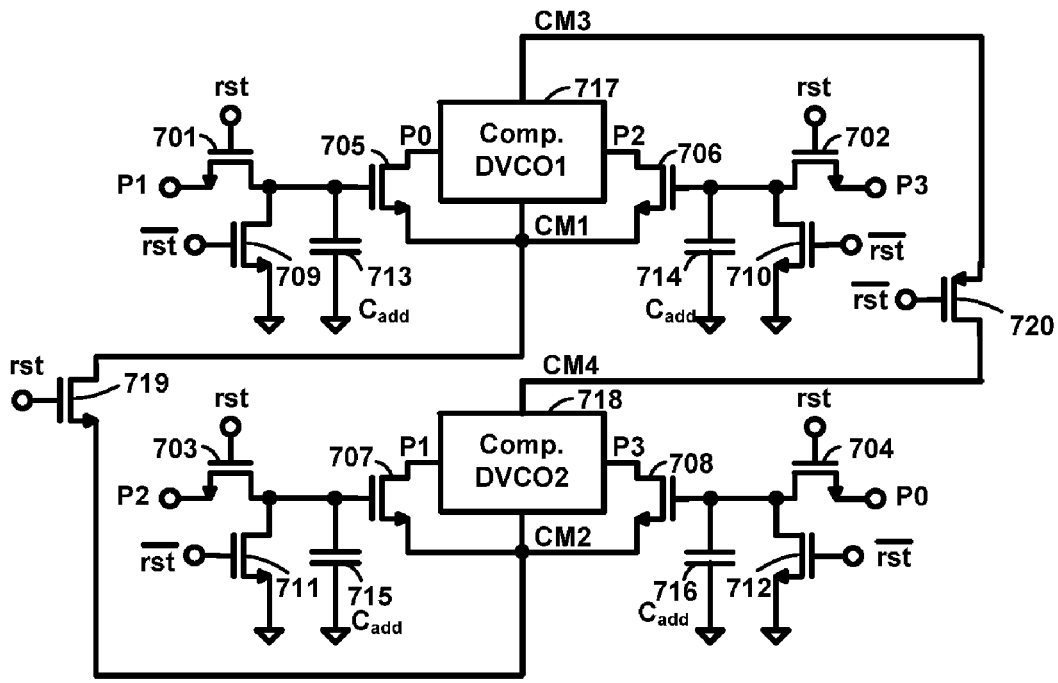
FIG. 7 is a start-up circuit to prevent I/Q phase ambiguity.

At circuit start-up, the oscillator I/Q phases may lock into either +90° or −90° mode. In some applications, this can be detected and fixed. For example, for an RF transmitter, the polarity of the quadrature base-band signal can be inverted if I-to-Q is −90° instead of +90°. Similarly, for an RF receiver, the polarity can be inverted in the digital baseband processor. For applications that cannot tolerate I/Q phase ambiguity, a start-up circuit is proposed. To prevent I/Q phase ambiguity, the start-up circuit shown in FIG. 7 can be employed. A reset signal is required for the start-up circuit. It can be provided either by a power-on-reset circuit or by a digital control circuit. During reset, the two tail tanks are shorted to allow coupling transistors to override the existing state.

When the reset signal is enabled, the coupling transistors 705, 706, 707, and 708 are enabled. The pass-gate transistors 701, 702, 703, and 704, together with the capacitors 713, 714, 715 and 716 with value $C_{add}$, form RC delay paths. The two copies of complementary differential VCOs force differential phase on P0/P2 and P1/P3. Therefore, the coupling circuit needs to provide a 180°+n×360° phase shift from P0 to P2 and from P1 to P3, where n is an integer. In terms of delay, this relation can be written as $$2(\tau_{RC} + \Delta\tau) = \frac{T_{peri}}{2} + nT_{peri} \quad \text{(EQ. 1)}$$

where $\tau_{RC}$ is the delay provided by the pass-gate transistor and $C_{add}$. Also, $$\tau_{RC} \approx \frac{1}{2R_{on,passgate}(C_p + C_g + C_{add})}$$

where $C_p$ is the parasitic capacitance and $C_g$ is the gate capacitance of the coupling transistors 705, 706, 707, and 708. $\Delta_\tau$ is the delay corresponding to the phase shift provided by the LC tank when it operates away from the resonant frequency. $T_{peri}$ is the period of the oscillation waveform.

The LC tank impedance at a frequency $\Delta\omega$ away from the resonance frequency $\omega_o$ is $$Z(\Delta\omega) = \frac{R}{1 + j2Q\frac{\Delta\omega}{\omega_o}}$$

where R is the equivalent parallel tank resistance. The phase of $Z(\Delta\omega)$ is $$\angle\{Z(\Delta\omega)\} = \tan^{-1}\left(-2Q\frac{\Delta\omega}{\omega_o}\right). \quad \text{(EQ. 2)}$$

The coupling transistors (705, 706, 707, 708) convert voltage to current, and the LC tank shifts the waveform by $\angle\{Z(\Delta\omega)\}$. We can rewrite (EQ. 1) as $$\frac{\tau_{RC}}{T_{peri}} = \frac{1}{4} + \frac{n}{2} + \frac{\angle\{Z(\Delta\omega)\}}{2\pi} \quad \text{(EQ. 3)}$$

and $$T_{peri} = \frac{1}{2\pi(\omega_o + \Delta\omega)}.$$

We can choose $$\tau_{RC} = \frac{1}{4}T_{peri}.$$

For n=0, this choice would yield $\Delta\omega$=0 and $\angle\{Z(\Delta\omega)\}$=0. Since $-\pi/2 \leq \angle\{Z(\Delta\omega)\} \leq \pi/2$, there is no solution for any other integer (i.e., n≠0). For n=−1, $\angle\{Z(\Delta\omega)\}$ needs to provide a phase-shift of −180° to become a valid mode. There is plenty of margin to eliminate this mode even if $\tau_{RC}$ differs from $$\frac{T_{peri}}{4}$$

and if the non-ideal LC tank may provide slightly more phase shift than ±90°.

When the reset signal is turned off, the coupling transistors are turned off and coupling through the tail tanks is turned on. Some energy stored in the main tanks is transferred to the tail tanks to establish the correct I/Q phase relationship.

Phase Noise Analysis—an Overview

Figure 8:
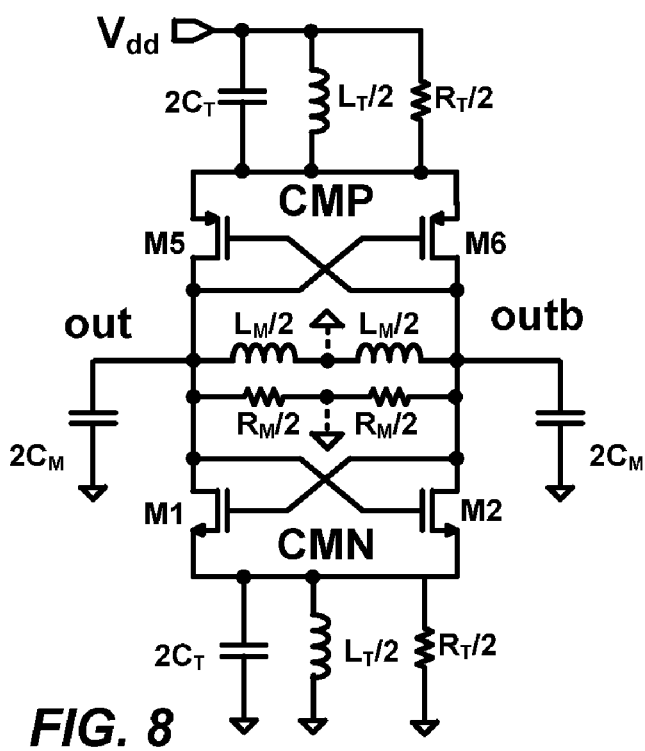
FIG. 8 is a circuit diagram of the QVCO half-circuit for phase noise analysis.

The proposed circuit can be analyzed as a parallel combination of two copies of the half circuit shown in FIG. 8. This half circuit has the form of a complementary LC-VCO using the noise filtering technique for phase noise reduction as described in E. Hegazi, J. Rael, and A. Abidi, "The Designer's Guide to High-Purity Oscillators" and E. Hegazi, H. Sjöland, and A. A. Abidi, "A filtering technique to lower LC oscillation phase noise." However, the mechanisms described in the given references cannot fully explain the noise reduction. In a differential LC-VCO, the current due to even-order distortion of the cross-coupled pair I-V characteristic appear as common-mode current at even harmonics. A DC component of this current consumes power and introduces more noise without increasing the oscillation amplitude, and thus it increases the noise factor, which is defined as the total phase noise divided by the phase noise due to tank loss. The noise filtering technique requires a tail tank with high tank impedance at resonance to eliminate the DC component of the common-mode current due to even-order distortion, and thus, bring the noise factor to the theoretical minimum value of 1+γ, where γ equals ⅔ for long-channel devices and can be significantly larger for short-channel devices as described in A. A. Abidi, "High-frequency noise measurements on FET with small dimensions," IEEE Trans. Electron Devices, vol. 33, pp. 1801-1805, November 1986, which is incorporated by reference herein. For the proposed circuit, the tail tank capacitance must be comparable to the main tank capacitance in order to reduce I/Q mismatch. As will be shown in later sections of this document, the optimal $C_T/C_M$ ratio to minimize the noise factor while providing low I/Q mismatch is 0.5. As a result, the tail tank resistance $R_T$, which is inversely proportional to $C_T$ for a given quality factor, is not high enough to eliminate the aforementioned current component. Instead, the DC component of the common-mode current increases the tail tank's amplitude, which also helps to reduce the phase noise.

Noise amplitude generated by each copy of the half circuit is evenly distributed to both half-circuit copies through the tail tanks. As a result, the total noise power of the complete QVCO is half that of a single half-circuit. Thus, the phase noise is reduced by 3 dB. That is $$L_{QVCO}(\Delta\omega) = \frac{L_{halfckt}(\Delta\omega)}{2}. \quad \text{(EQ. 4)}$$

The loss in the tail tank prevents the noise from distributing evenly in the two half-circuits, and the noise reduction would be less than this theoretical maximum value. The tail-tank capacitor $2C_T$, together with the switches, becomes a discrete-time resistor between the two main tanks with resistance $$R_{eq} = \frac{1}{(2f_o)(2C_t)}.$$

The sampling frequency is $2f_o$ because the main tank is shorted to a tail tank twice per cycle. The settling time constant for synchronizing the energy states in the two main tanks is $R_{eq}C_M$. Therefore, the settling speed is proportional to $C_T$. To create effective coupling through tail tanks, we must make sure that $$R_{eq}C_M < \frac{Q_M(f = f_o)}{f_o} \quad \text{(EQ. 5)}$$

and $$R_{eq}C_M < \frac{Q_T(f = 2f_o)}{2f_o} \quad \text{(EQ. 6)}$$

where $Q_M$ and $Q_T$ are the main and tail tank quality factors, respectively. If this condition is not met, the deviation from the periodic steady-state solution introduced by noise in a half-circuit cannot be effectively communicated to the other half-circuit. This is because a significant amount of "deviation" energy stored in the tanks will be lost through the lossy tanks. In other words, each main tank appears more isolated.

Intuitively, this phenomenon can be understood as follows: Leeson's equation can be re-written in the following form:

$$L\{\Delta\omega\} = \frac{F}{V_1^2} \frac{kT}{C} \frac{\omega_o}{Q\Delta\omega^2}. \quad \text{(EQ. 7)}$$

Since any LC tank forms a bandpass filter, the $$\frac{kT}{C}$$

term can be thought of as the available noise power after filtering by the bandpass filter. If $R_{eq}C_M$ is small, then the capacitors in other tanks can be "seen" by a main tank to reduce the available thermal noise power, which would also reduce the phase noise.

Phase Noise Analysis—an Intuitive Understanding

Figure 9:
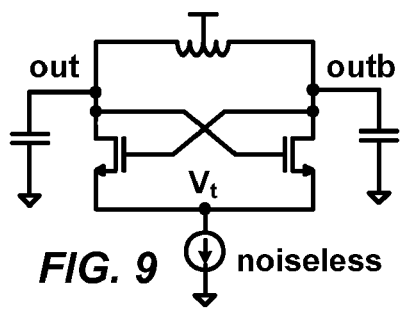
FIG. 9 shows an LC-VCO driven by a noiseless current source.
Figure 10:
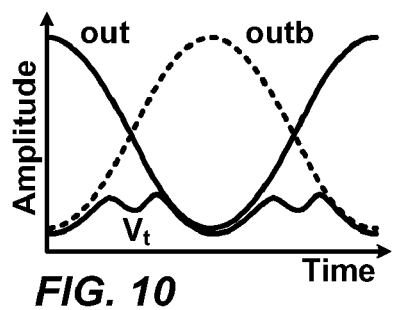
FIG. 10 shows the oscillation waveform of a current-source driven LC-VCO.

FIG. 9 shows a differential LC-VCO driven by a noiseless current source. This oscillator achieves a theoretical minimum phase-noise factor of $(1+\gamma)$. Its oscillation waveform is shown in FIG. 10. Near the zero-crossing point, both transistors in the cross-coupled pairs operate in the saturation region. The ideal current source forces a constant sum of drain current flowing through the two transistors, and the waveform at node $V_t$ moves up near the zero-crossing point in order to satisfy the drain current requirement. Transistor noise is injected into the resonator only when both transistors are on. When one transistor in the cross-coupled pair turns off, no noise can be injected into the resonator. If a larger transistor size is used, the peak noise current density increases due to the increased $g_m$. However, the current switching becomes faster and the duration of noise injection, or the noise sampling window, is reduced. Thus, to a first-order, the noise factor is independent of transistor size.

Figure 11:
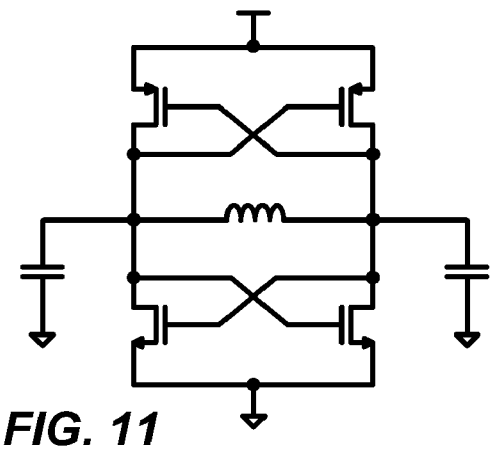
FIG. 11 is a complementary LC-VCO without tail tanks and current source.

A complementary LC-VCO without the tail tanks is shown in FIG. 11. Two aspects of transistor operation must be considered: the noise injected near the zero-crossing point, when transistors operate in the saturation region, and the noise injected when one transistor is in the triode region and the other transistor is off. Near the zero-crossing point, the noise current injected is proportional to transistor size. However, the duration wherein transistors operate in the saturation region is determined solely by the oscillation waveform. Thus, the noise window does not shrink with the increase of transistor sizing as in a current-source driven LC-VCO. As a result, there is an additional common-mode current component that wastes power and produces more noise without increasing the energy stored in the oscillation tank. When a transistor enters the deep triode region, a portion of the noise current flows through $R_{on}$, but the rest is injected into the oscillation tank. Since the noise current density is proportional to $R_{on}$, and current is split between $R_{on}$ and the resonator tank based on their relative conductances, the noise current power injected into the resonator tank is independent of transistor sizing to a first order. In both aspects, we have more noise injected into the resonator tank than an LC-VCO driven by a current source. Thus, this circuit is expected to have a lower noise factor in comparison to a current-source driven LC-VCO.

The noise filtering technique attempts to eliminate the second harmonic of the common mode current by introducing high impedance tail tanks at frequency $2f_o$. However, in our case, common mode current at frequency $2f_o$ is essential for generating reliable quadrature phases. In comparison to a complementary LC-VCO without the tail tanks, the common mode current increases the amplitude of tail tank waveforms. This current increases the overall energy stored in the oscillator and is not wasted. Intuitively, we would expect this half circuit to have a noise factor less than a complementary LC-VCO without tail tanks. Tail tanks provide extra energy storage to the system, and we expect them to have a behavior similar to multiple LC-VCOs in parallel. Noise current is distributed among all the LC-tanks to cause a reduction in phase noise.

Phase Noise Analysis—Contribution from Tank Loss

In FIG. 8, the tail tank is terminated to ground with tail tank inductance $L_T/2$ and resistance $R_T/2$. To simplify the analysis, the main tank is split into two halves, each half having inductance $L_M/2$ and resistance $R_M/2$. In the subsequent analysis, each half main-tank is terminated to ground, making it similar to a tail tank. This model would introduce common mode noise, but it appears as amplitude modulation and does not affect the phase noise analysis. We have a total of four tanks: two half-main tanks and two half-tail tanks.

Main tank resistance $R_M/2$ introduces noise current density $$\frac{4kT}{R_M/2}$$

near the frequency $f_o$, and tail tank resistance $R_T/2$ introduces noise current density $$\frac{4kT}{R_T/2}$$

near the frequency $2f_o$. The noise current introduced by main tank resistors is transferred to tail tanks by the cross-coupled pairs and vise versa. Cross-coupled pairs serve as single-balanced mixers to translate the frequency of noise current injected by main and tail tank resistors. A sideband noise current at frequency $(f_o+\Delta f)$ is up-converted to frequency $(2f_o+\Delta f)$ when transferred from main tank to tail tank. Similarly, a sideband noise current at frequency $(2f_o+\Delta f)$ is down-converted to frequency $(f_o+\Delta f)$ when transferred from tail tank to main tank. The transistors tightly couple the main and tail tanks together and force the same amount of jitter at all nodes. Thus, the noise current is split between the main and tail tanks to yield the same jitter in the main and tail tank oscillation waveforms. We will first determine the current conversion factor of the cross-coupled pairs. The phase noise due to tank loss can then be determined by solving for the total noise current injected to the main tank by the main and tail tank resistance.

Cross-coupled Pair Conversion Factor

Let the fundamental component of the current flowing through the main tank be $$I_{o,m}(t) = A_m \sin(\omega_o t).$$

Let the noise current injected by a main tank resistor $R_M/2$ be $$I_n(t) = A_n \cos((\omega_o + \Delta\omega)t)$$
$$= A_n[\cos(\omega_o t)\cos(\Delta\omega t) - \sin(\omega_o t)\sin(\Delta\omega t)].$$

If all of this current flows into the main tank, then the AM component of the noise current is $-A_n \sin(\Delta\omega t+\phi_n)\sin(\omega_o t)$, and the PM component of the noise current is $A_n \cos(\Delta\omega t+\phi_n)\cos(\omega_o t)$. In a real circuit, the AM current component is sinked to the nonlinear circuit, and only the PM component is injected into the tank resistance, causing an output waveform containing only PM noise.

Whenever a transistor in a cross-coupled pair enters the linear region, the transistor noise current is allowed to flow into the tail tanks. Due to the switching action of cross-coupled pairs, the noise current is up-mixed to frequency $(2\omega_o+\Delta f)$. Assume that all noise current is pushed into the tail tank, the corresponding mixing function would be a 50% duty cycle square wave with amplitude alternating between +1 and −1. The fundamental component of the square wave is $$\frac{4}{\pi}\sin(\omega_o t).$$

The resulting noise after mixing by this function would be:

$$\begin{aligned}I_{n,m\to t}(t) &= A_{n,m}\cos((\omega_o + \Delta\omega)t)\frac{4}{\pi}\sin(\omega_o t)\\&= A_{n,m}[\cos(\omega_o t)\cos(\Delta\omega t) - \sin(\omega_o t)\sin(\Delta\omega t)] \times\\&\quad \frac{4}{\pi}\sin(\omega_o t)\\&= A_{n,m}\frac{2}{\pi}[\sin(2\omega_o t)\cos(\Delta\omega t) -\\&\quad (1 - \cos(2\omega_o t))\sin(\Delta\omega t)].\end{aligned}$$

We are interested only in the component near frequency $2\omega_o$. The waveform at the tail tank has the form $\cos(2\omega_o t)$. Therefore, the PM sideband noise is $$A_{n,m}\frac{2}{\pi}\cos(\Delta\omega t + \phi_n)\sin(2\omega_o t).$$

Once again, in a real circuit, the AM component is absorbed by the nonlinear circuit and is not injected into the tank resistor. Comparing this situation to the case when all noise current is injected into the main tank, the conversion factor is $$\frac{2}{\pi}.$$

Now, let us consider the case when noise current is generated from a tail tank resistor and transferred to a main tank. The fundamental component of the current that flows through the tail tank capacitor is $$I_{o,t} = A_t \cos(2\omega_o t).$$

The noise current injected by the tail tank resistor is $$I_{n,t}(t) = A_{nt}\cos((2\omega_o + \Delta\omega)t)$$
$$= A_{nt}[\cos(2\omega_o t)\cos(\Delta\omega t) - \sin(2\omega_o t)\sin(\Delta\omega t)].$$

The PM component is $-A_n \sin(2\omega_o t)\sin(\Delta\omega t)$.

Similar to the previous case, the conversion factor can be determined by assuming that all noise current flows into the main tank from the tail tank. The mixing function is $$\frac{4}{\pi}\sin(\omega_o t)$$

and the resulting noise current injected into the main tank is $$I_{n,t\to m}(t) = A_{nt}\cos((2\omega_o + \Delta\omega)t)\frac{4}{\pi}\sin(\omega_o t)$$

-continued $$= A_{nt}[\cos(2\omega_o t)\cos(\Delta\omega t) - \sin(2\omega_o t)\sin(\Delta\omega t)] \times$$

$$\frac{4}{\pi}\sin(\omega_o t)$$

$$= A_{nt}\frac{2}{\pi}[(\sin(3\omega_o t) - \sin(\omega_o t))\cos(\Delta\omega t) +$$

$$(-\cos(3\omega_o t) + \cos(\omega_o t))\sin(\Delta\omega t)].$$

We are only interested in the component near frequency $\omega_o$. The PM sideband noise current is $$A_{nt}\frac{2}{\pi}\cos(\omega_o t)\sin(\Delta\omega t).$$

Once again, it is scaled by the factor $$\frac{2}{\pi}.$$

Thus, the conversion gain through the mixer is $$\beta = \frac{2}{\pi}. \quad \text{(EQ. 8)}$$

Phase Noise Expression Due to Injected Noise Current

For a current-biased LC-VCO, the phase noise due to the tank resistance R is (Hegazi, J. Rael, and A. Abidi, "The Designer's Guide to High-Purity Oscillators")

$$L(\Delta\omega) = \frac{4kTFR}{V_I^2}\left(\frac{\omega_o}{2Q\Delta\omega}\right)^2.$$

This expression can be re-written as $$L(\Delta\omega) = \frac{(4kTF/R)R^2}{V_I^2}\left(\frac{\omega_o}{2Q\Delta\omega}\right)^2$$

where 4kTF/R is the equivalent noise current spectral density generated by the tank resistor. The noise current is injected into tank resistor R to produce the noise voltage. This expression can be generalized by replacing 4kTF/R with $\overline{I}_{n,srci}^2/\Delta f$, which is the noise current density injected into the tank due to noise source i. Hence, $$L_{srci}(\Delta\omega) = \frac{(\overline{I}_{n,srci}^2/\Delta f)R^2}{V_I^2}\left(\frac{\omega_o}{2Q\Delta\omega}\right)^2. \quad \text{(EQ. 9)}$$

The overall phase noise would be $$L(\Delta\omega) = \frac{\sum_i (\overline{I}_{n,srci}^2/\Delta f)R^2}{V_I^2}\left(\frac{\omega_o}{2Q\Delta\omega}\right)^2. \quad \text{(EQ. 10)}$$

Main Tank Resistor Noise Current Distribution

Let us first consider the current from the main tanks, it is distributed among the main and tail tanks. Let $\alpha_1$ be the portion of current generated by a half main-tank and staying in the half main-tank, and let $$\frac{1}{2}(1 - 2\alpha_1)$$

be the portion of the current injected into a half tail-tank. As mentioned previously, the mixer has a conversion gain of $$\beta = \frac{2}{\pi}.$$

The portion of current density injected into a half main-tank is $$\overline{I}_{n,MtoM} = \alpha_1^2 4kT/(R_M/2).$$

This current is injected into tank resistor $R_M/2$ and is converted to noise voltage $$\overline{V}_{n,MtoM}^2 = \alpha_1^2 4kT\frac{R_M}{2}.$$

The portion of the current injected into a half tail-tank is $$\overline{I}_{n,MtoT}^2 = \frac{1}{4}\beta^2(1-2\alpha_1)^2 4kT/(R_M/2)$$

and it becomes noise voltage:

$$\overline{V}_{n,MtoT}^2 = \frac{1}{4}\beta^2(1-2\alpha_1)^2 4kT\left(\frac{R_T^2}{2R_M}\right).$$

The phase noise due to noise generated by resistor $R_M/2$ and injected into the main tank is $$L_{MtoM}(\Delta\omega) = \frac{\alpha_1^2 4kT(R_M/2)}{V_M^2}\left(\frac{\omega_o}{2Q_M\Delta\omega}\right)^2. \quad \text{(EQ. 11)}$$

The phase noise due to noise generated by resistor $R_M/2$ and injected into the tail tank is $$L_{MtoT}(\Delta\omega) = \frac{\frac{1}{4}\beta^2(1-2\alpha_1)^2 4kT}{V_T^2} \times \left(\frac{2\omega_o}{2Q_T\Delta\omega}\right)^2. \quad (EQ.\ 12)$$

The circuit forces the same jitter for all nodes of the oscillator. Since the oscillation frequency at the tail tank is twice that of the main tank, the phase noise at the main tank is four times (or 6 dB) higher than the phase noise at the tail tank:

$$4L_{MtoM}(\Delta\omega) = L_{MtoT}(\Delta\omega)$$

Solving (EQ. 11) and (EQ. 12), we have $$\alpha_1 = \frac{1}{2}\frac{k_1}{k_1+1}, \quad k_1 = \frac{1}{2}\beta\frac{V_M}{V_T}\frac{R_T}{R_M}\left(\frac{2Q_M}{Q_T}\right)^2. \quad (EQ.\ 13)$$

Tail tank Resistor Noise Current Distribution

Let $\alpha_2$ be the portion of the noise current injected from a tail tank to the main tank. The conversion factor for the noise current injected from a tail tank to the main tank is also $\beta$. Following a similar derivation procedure, we have $$\alpha_2 = \frac{1}{2}\frac{k_2}{k_2+1}, \quad k_2 = \frac{1}{2}\frac{1}{\beta}\frac{V_M}{V_T}\frac{R_T}{R_M}\left(\frac{2Q_M}{Q_T}\right)^2. \quad (EQ.\ 14)$$

Overall Phase Noise Due to Tank Loss

The ratio of resulting phase noise to that of the case without tail tanks is $$\frac{L_{tankloss}(\Delta\omega)}{L_{notailtank}(\Delta\omega)} = \frac{\alpha_1^2 \frac{1}{R_M} + \alpha_2^2 \beta^2 \frac{1}{R_T}}{\frac{1}{2}\frac{1}{R_M}}.$$

Typically, phase noise reduction of 1-2 dB can be obtained due to tail tanks. The phase noise due to main and tail tank loss is $$L_{tankloss}(\Delta\omega) = \left(\frac{\alpha_1^2 \frac{1}{R_M} + \alpha_2^2 \beta^2 \frac{1}{R_T}}{\frac{1}{2}\frac{1}{R_M}}\right)\frac{4kTR_M}{V_M^2} \times \left(\frac{\omega_o}{2Q_M\Delta\omega}\right)^2. \quad (EQ.\ 15)$$

Phase Noise Analysis—Noise Factor Analysis

The noise current produced by transistors disturbs the oscillator in a different way, in comparison to the noise current from main and tail tank resistors. Since the drain node of a transistor connects to the main tank and the source node connects to the tail tanks, the same noise current flows into both the main and the tail tanks. The impulse sensitivity function (ISF) method as described in A. Hajimiri and T. H. Lee, "A general theory of phase noise in electrical oscillators," IEEE J. Solid-State Circuits, vol. 33, pp. 179-194, February 1998, which is incorporated by reference herein, is employed to analyze the phase noise due to transistor thermal noise.

Figure 12:
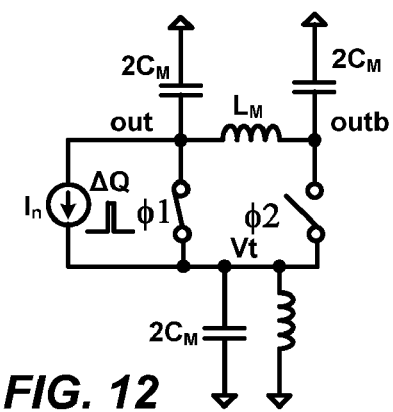
FIG. 12 shows the simplified circuit model for studying the impulse sensitivity function (ISF).
Figure 13:
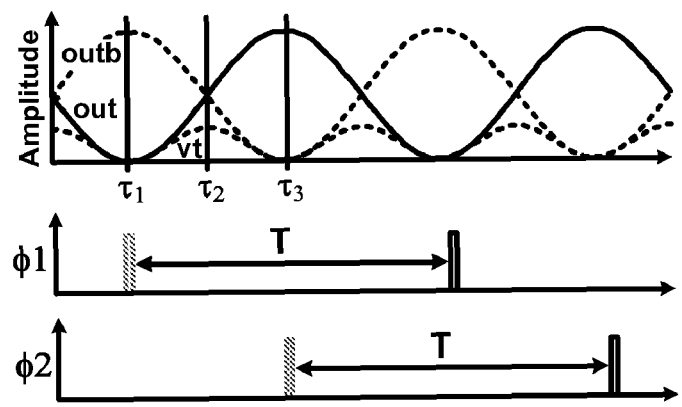
FIG. 13 shows the oscillation waveform and $\phi_1$ and $\phi_2$ clocks in the FIG. 12 circuit.

FIG. 12 shows a simplified circuit model for studying the ISF. Only one tail tank is included in the model. Transistors in the cross-coupled pairs are replaced by two switches driven by periodic short pulse trains $\phi_1$ and $\phi_2$. These switches simulate the effect of a transistor operating in the deep-triode region. FIG. 13 shows the oscillation waveform together with the $\phi_1$ and $\phi_2$ clocks. An impulse current containing charge $\Delta Q$ is injected from node out to node $v_t$. Depending on the timing of the impulse current injection, different amounts of phase shift are produced. We will consider three cases wherein the impulse current is injected at the three time instants $\tau_1$, $\tau_2$ and $\tau_3$ as shown in FIG. 13. Clocks $\phi_1$ and $\phi_2$ do not start until after time $\tau_3$; however, in FIG. 13, they are shown to start before $\tau_3$ in order to demonstrate the periodicity of the two clocks.

If the two switches are open all the time, the main tank filters the injected impulse current and produces a sinusoidal waveform at frequency $f_o$. Similarly, the tail tank would have a sinusoidal waveform at frequency $2f_o$. At the instant when the impulse current is injected, the charge is stored in main and tail tank capacitors, and the noise voltage on nodes out and outb would have opposite polarity. The instantaneous voltage at the two nodes due to the injected impulse current defines the amplitude of the sinusoidal noise waveforms. Let $\Delta Q$ be the charge injected by the impulse current. The voltage amplitudes at nodes out and $v_t$ are $$-\frac{\Delta Q}{2C_M} \text{ and } \frac{\Delta Q}{2C_T},$$

respectively. Node outb would have the same amplitude as node out but with reversed phase.

Figure 14:
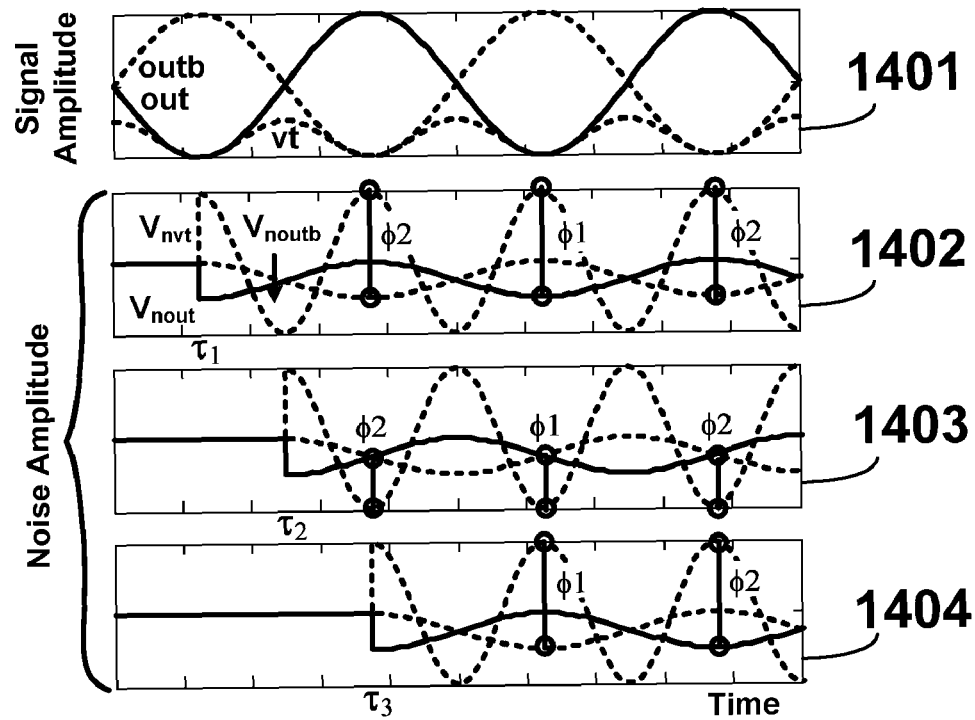
FIG. 14 shows the oscillation waveform and the noise amplitude at nodes out, outb, vt due to an impulse current injected at time $\tau_1$ (1402), $\tau_2$ (1403), and $\tau_3$ (1404).
Figure 15:
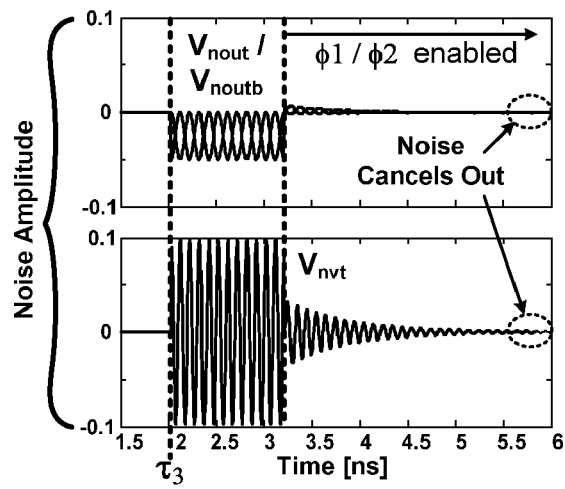
FIG. 15 shows the cancellation of noise waveforms.

When the switches are closed, charge-sharing occurs and equalizes the amplitude between the main and the tail tank waveforms. The oscillation waveform together with the noise waveform due to the impulse noise current is shown in FIG. 14. In FIG. 14, plot 1402, the noise is injected at time $\tau_1$, which is a valley of the waveform at node out. When the switches are closed, the main tank noise waveform is at a valley while the tail tank waveform is at a peak. Since opposite but equal amounts of charge are stored in the main and tail tank capacitors, the noise waveforms at the main and tail tanks are completely canceled out. As we shift the timing of the noise current injection away from time $\tau_1$, the cancelation mechanism becomes less effective. Plot 1403 shows the case when the impulse current is injected at time $\tau_2$. When the switches are closed, the main tank waveform is at a mid-point while the tail tank waveform is at a valley. As a result, the noise amplitudes do not completely cancel out. The worst case occurs when the noise impulse current is injected at time $\tau_3$. When the switches are closed, both the main and tail tank waveforms are at peaks, the noise waveform at the tail node actually enhances the noise amplitude at the main tank. This is not a problem because the corresponding transistor injects no noise current near $\tau_3$ because it is turned off. The simulated waveform for impulse noise current injected at time $\tau_3$ is shown in FIG. 15. Once the $\phi_1$ and $\phi_2$ clocks are enabled, the noise is canceled out within a few cycles.

For a real oscillator, the noise distribution is not governed by charge-sharing as in the simplified model. It depends on oscillation amplitudes and capacitances of the main and tail tanks. The noise is distributed in a way that introduces the same amount of time shift for all oscillator nodes. As a result, the simplified model cannot provide an accurate prediction of ISF. However, for the special case when the impulse current is injected at time $\tau_1$, the result predicted by the simplified model remains valid because all nodes in the oscillator would have the same (zero) time-shift. The finite Q of the main and tail resonator tanks and circuit nonlinearities would also reduce the effectiveness of noise cancelation. For a reasonable choice of Q>8, at least 90% of the noise is canceled out.

Based on ISF analysis using the simplified model, we can make the following conclusion: When a transistor operates the in deep-triode region, a portion of the noise current flows through the resistor $R_{on}$, and the remaining noise current, which is injected into the main and tail tanks, is mostly canceled out. Thus, the proposed circuit is immune to the noise produced near the peaks and valleys of the oscillation, which is similar to the behavior of a current-source driven LC-VCO.

Figure 16:
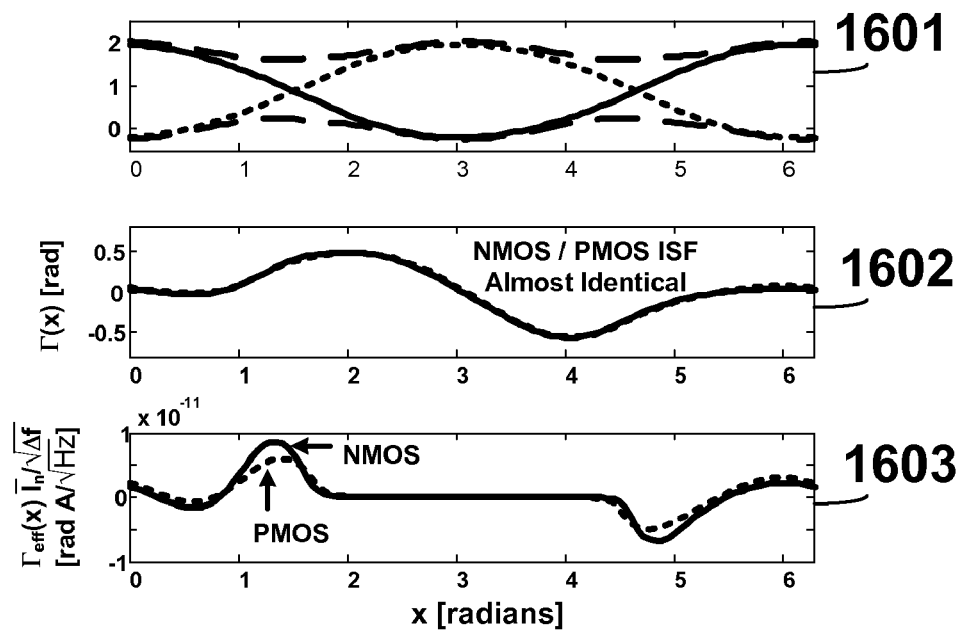
FIG. 16 shows the oscillation waveform (1601), NMOS/PMOS impulse sensitivity function (ISF) (1602) and the ISF normalized by noise current. (1603)

FIG. 16 shows the ISFs and the noise-density normalized ISF based on circuit simulation. As shown in plot 1602, the ISF has a wide and near-zero response when a transistor operates in the linear region. Plot 1603 shows the ISF normalized to instantaneous rms noise current density. The peaks of the normalized ISF appear near zero-crossings and very little noise injected by a transistor in the linear region becomes phase error. A similar procedure can be performed to determine the phase noise due to tank loss. Phase noise can be determined using the equations in A. Hajimiri and T. H. Lee, "A general theory of phase noise in electrical oscillators." The noise factor based on ISF analysis is 2.08. This result is very close to $$1 + \frac{1}{2}(\gamma_n + \gamma_p),$$

which is 2.19. Thus, we can conclude $$F \approx 1 + \frac{1}{2}(\gamma_n + \gamma_p). \quad \text{(EQ. 16)}$$

The overall phase noise predicted by the ISF method is within 0.5 dB of the Spectre-RF result.

Figure 17:
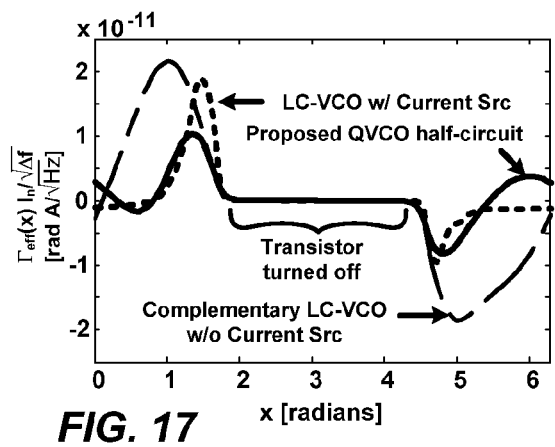
FIG. 17 shows Noise normalized ISF for an LC-VCO driven by a current source, a complementary LC-VCO without a current source, and the proposed QVCO half-circuit.

FIG. 17 shows the ISF normalized by noise current density for three different circuits: an LC-VCO driven by a noiseless current source, a complementary LC-VCO without a current source (FIG. 11), and the proposed QVCO half-circuit (FIG. 8). The current-source driven LC-VCO is designed to produce the same amplitude and the same frequency as the QVCO half-circuit. For a fair comparison, the NMOS and PMOS ISFs for the complementary LC-VCO and the QVCO half-circuit are averaged and properly scaled. The tail tanks of the proposed half-circuit significantly reduce phase noise due to noise current injected in both the saturation and the linear regions, demonstrating the effectiveness of noise cancelation. The ISF analysis shows that the QVCO half-circuit has 1.7 dB lower phase noise when compared to a noiseless current-source driven LC-VCO. This result is similar to the Spectre-RF result, which shows a 1.4 dB reduction.

Figure 18:
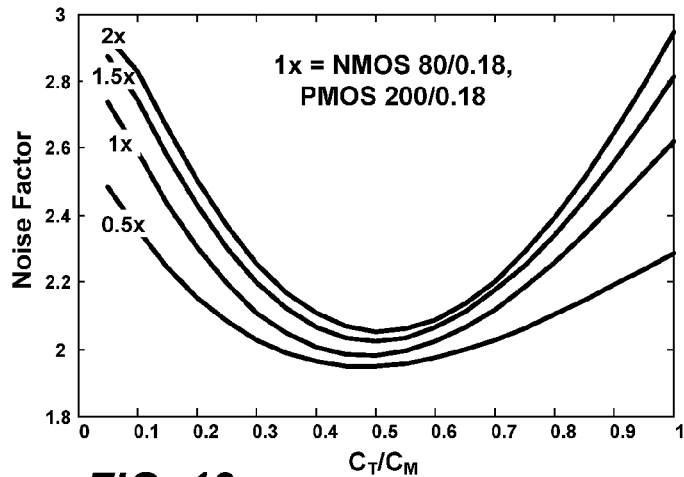
FIG. 18 shows noise factor as a function of $C_T/C_M$ ratio for four different transistor sizes.

FIG. 18 shows the noise factor from the Spectre-RF simulation as a function of the $C_T/C_M$ ratio for four different transistor sizes. For small transistor sizing, the noise factor is lower and is relatively flat as a function of $C_T/C_M$, and the noise filtering technique is sufficient to explain the phase noise performance. However, in order to produce reliable quadrature phases, larger transistor sizing is required, as this gives better synchronization of the two half-circuits in order to reduce I/Q mismatch. If capacitor $C_T$ is too small, the noise cancelation mechanism is not very effective because an impulse noise current could introduce larger noise amplitude on the tail tanks. The nonlinear active circuit would force waveforms at all nodes to have the same jitter. As a result, much of the noise power stored in tail tanks is folded back to the main tank when they are not perfectly canceled out. If $C_T$ is too large, the oscillator cannot produce sufficient amplitude for the tail node waveforms, making it more similar to a complementary LC-VCO without a current source (FIG. 9). The optimal $C_T/C_M$ ratio is close to 0.5, and it is relatively independent of transistor sizing.

Phase Noise Analysis—Overall Phase Noise Expression

Combining (EQ. 4), (EQ. 8), (EQ. 13), (EQ. 14), (EQ. 15), and (EQ. 16), we have $$L(\Delta\omega) = \frac{4kTFR_{eff}}{V_M^2}\left(\frac{\omega_o}{2Q_M\Delta\omega}\right)^2 \quad \text{(EQ. 17)}$$

$$R_{eff} = \left(\alpha_1^2 + \alpha_2^2\beta^2\frac{R_M}{R_T}\right)R_M$$

$$F = \frac{1}{2}(\gamma_n + \gamma_p)$$

$$\beta = \frac{2}{\pi}$$

$$\alpha_1 = \frac{1}{2}\frac{k_1}{k_1+1}, \quad k_1 = \frac{1}{2}\beta\frac{V_M}{V_T}\frac{R_T}{R_M}\left(\frac{2Q_M}{Q_T}\right)^2$$

$$\alpha_2 = \frac{1}{2}\frac{k_2}{k_2+1}, \quad k_2 = \frac{1}{2}\frac{1}{\beta}\frac{V_M}{V_T}\frac{R_T}{R_M}\left(\frac{2Q_M}{Q_T}\right)^2$$

Design Considerations for Low I/Q Mismatch

Figure 19:
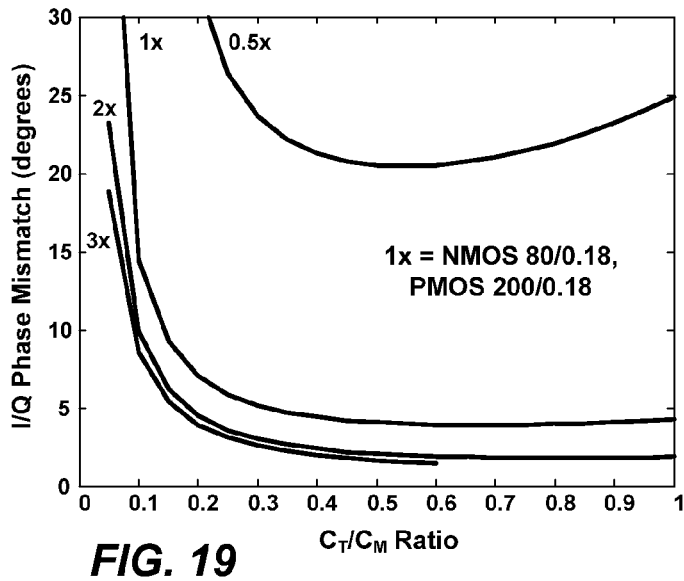
FIG. 19 shows I/Q mismatch with 1% CM mismatch between the two main tanks as a function of $C_T/C_M$ ratio for four different transistor sizes.

In order to study the influence of the $C_T$ value and transistor size on I/Q mismatch, a 1% $C_M$ mismatch is assumed between the two main tanks. FIG. 19 shows I/Q mismatch as a function of $C_T/C_M$ for four different transistor sizings. For small transistor size, there is a significant amount of I/Q mismatch; indeed, it can exceed 20°. As we increase the transistor size, I/Q mismatch of less than 2° can be achieved. For large transistor sizes, mismatch reduces with the increase of the $C_T/C_M$ ratio, there is very little improvement for $C_T/C_M$ ratios greater than 0.5. Variations in the manufacturing process can also cause a mismatch in the main tank inductance $L_M$, but its impact on I/Q mismatch is the same as the $C_M$ mismatch. A 1% mismatch in $L_M$ would have the same influence as a 1% mismatch in $C_M$.

Figure 20:
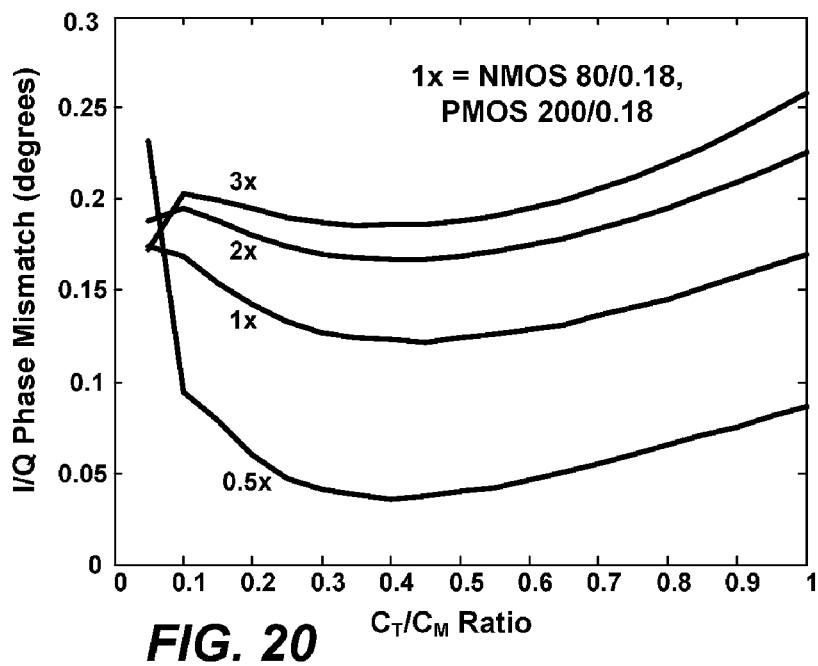
FIG. 20 shows I/Q mismatch with 1% mismatch between the two single-ended $C_T$ capacitors as a function of $C_T/C_M$ ratio for four different transistor sizes.

To study the effect of tail tank mismatches, a 1% mismatch is assumed between the two single-ended tail tank capacitors connecting to ground. FIG. 20 shows the resulting I/Q mismatch versus $C_T/C_M$ ratio for four different transistor sizes. The mismatch increases with the transistor size, and the minimum mismatch occurs when $C_T/C_M$=0.4. In all cases, the I/Q mismatch is less than 0.25°, which is much less than the I/Q mismatch introduced by $C_M$ mismatch.

Figure 21:
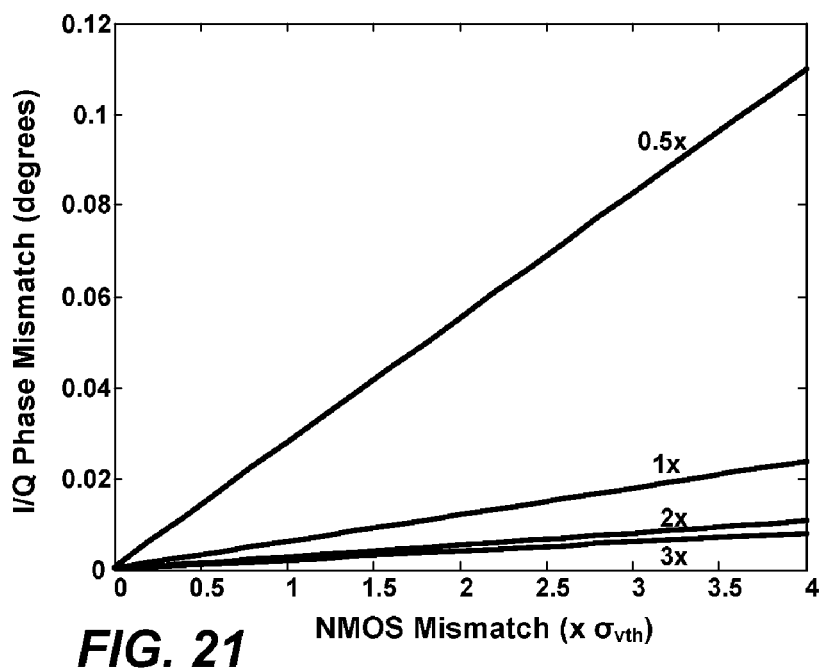
FIG. 21 shows I/Q mismatch as a function of a single NMOS transistor mismatch for four different transistor sizes.

To study the influence of transistor mismatch, an offset voltage is added to a single NMOS transistor in the oscillator. The resulting I/Q mismatch is shown in FIG. 21 as a function of $V_{th}$ mismatch up to $4\sigma_{th}$. The I/Q mismatch reduces with the increase of transistor size. In all cases, the I/Q mismatch is less than 0.12°. This amount of mismatch is trivial in comparison to I/Q mismatch due to $C_M$ mismatch.

The overall I/Q mismatch is dominated by the portion due to $C_M$ mismatch. Large transistor size and a $C_T/C_M$=0.5 should be chosen to reduce the I/Q mismatch. We have shown that the $C_T/C_M$ ratio for minimum noise factor is 0.5. Thus, low phase noise and low I/Q mismatch can both be achieved with the same design.

Experimental Results

TABLE I

Performance in comparison to prior QVCOs

| | Tech. | Freq | Tuning | FOM |
|---|---|---|---|---|
| P. Andreani and X. Wang | 0.35-μm | 2.27 GHz | 17% | 184 dB |
| M. Tiebout | 0.25-μm | 1.88 GHz | 12% | 185.5 dB |
| S. L. J. Gierkink, et al. | 0.25-μm | 5 GHz | 12% | 185 dB |
| A. Ravi, et al. | 0.18-μm | 5 GHz | 20% | 186.2 dB |
| This work | 0.18-μm | 5.1 GHz | 17% | 192 dB |
| This work | 0.18-μm | 5.3 GHz | 1% | 196 dB |

Two chips have been fabricated. The first chip is intended for wireless applications that require wide tuning range for channel selection. It provides 17% tuning centered at 5.1 GHz with 21 digital tuning keys and 2% continuous tuning in each key. The second chip is targeted for fiber-optic transceivers or wireless base-stations. It has a 1% continuous tuning range near 5.3 GHz. The capacitance at the tail tanks is chosen to be half that of the main tanks to maximize the tail inductor Q and to minimize the noise factor while keeping the layout area manageable.

Figure 22:
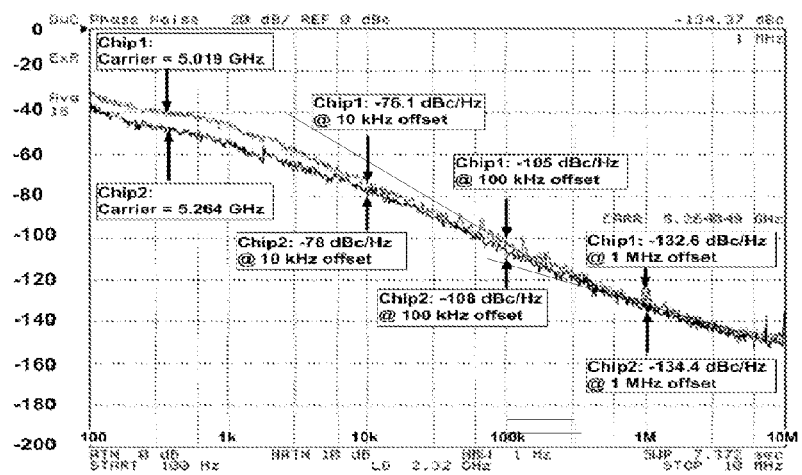
FIG. 22 shows the measured phase noise.
Figure 23:
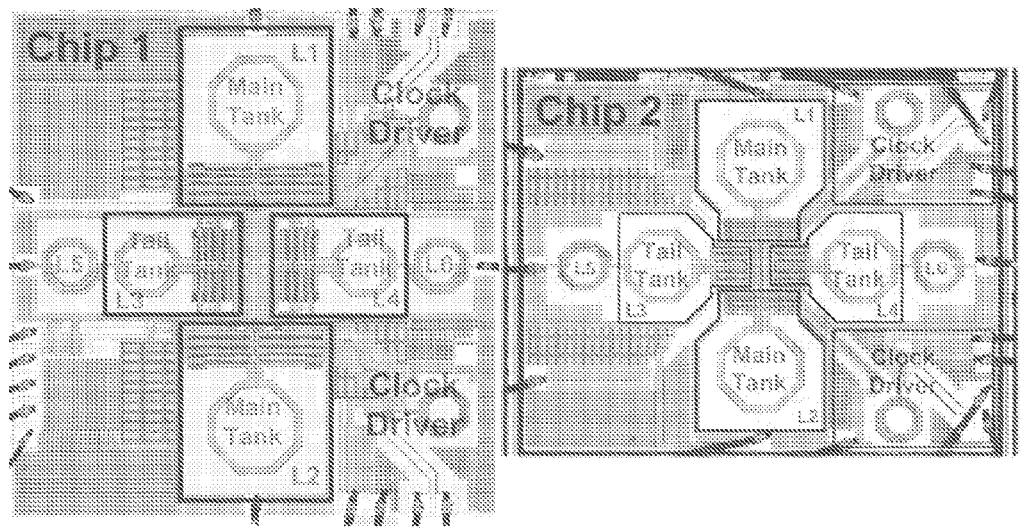
FIG. 23 shows the micrographs of chips.

FIG. 22 shows the phase noise of the two chips; they achieve −132.6 dBc/Hz and −134.4 dBc/Hz at 1 MHz offset. At a 100 kHz offset, the phase noise values are −105 dBc/Hz and −108 dBc/Hz respectively. The $1/f^3$ phase noise corner is at 300 kHz, which is close to the 200 kHz corner of a recently published complementary current-source driven LC-VCO that focuses on minimizing $1/f^2$ phase noise (P. Andreani and A. Fard, "More on the $1/f^2$ phase noise performance of CMOS differential-pair LC-tank oscillators," IEEE J. Solid-State Circuits, vol. 41, pp. 2703-2712, December 2006, which is incorporated by reference herein). They consume 27.7 and 20.7 mW and achieve their maximum FOM at 2 MHz offset of 192 and 196 dB, respectively. The measured phase noise is within 1 dB of the phase noise calculated using (EQ. 17). Table I shows the performance summary and comparison to other published QVCOs. Even though the two designs presented here are optimized for low phase noise instead of low FOM, the FOM are at least 5.8 dB better than prior work. FIG. 23 shows the micrographs. The cause of any I/Q mismatch is dominated by the capacitance mismatch in the two main tanks. A capacitance mismatch of 1% causes 2° of I/Q mismatch.

These two designs occupy core areas of 1.8×1.5 mm² and 1.7×1.8 mm², respectively. However, only 47% of the area is occupied by the oscillator in both designs. The remaining area contains clock drivers and metal fills. In a real system, an oscillator is often integrated with a PLL on chip, and these spaces can be filled with a loop filter instead.

Extended Application of Inventions

Figure 24:
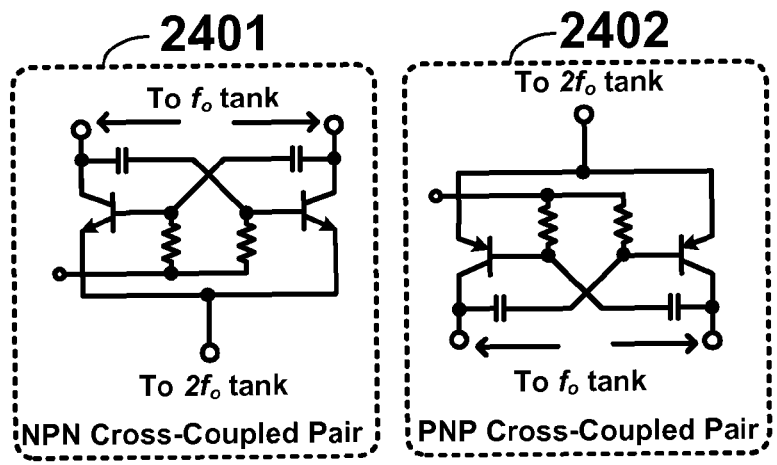
FIG. 24 shows the NPN and PNP cross-coupled pairs for bipolar implementation.
Figure 25:
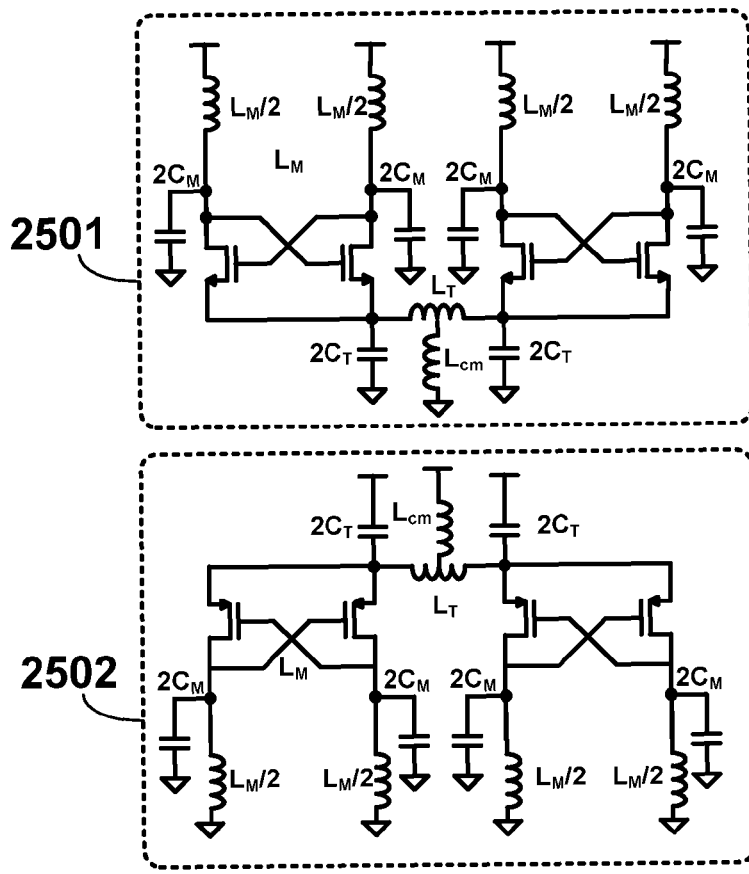
FIG. 25 shows oscillators implemented using only NMOS and PMOS cross-coupled pairs.

The proposed method can be implemented on a bipolar process with the NMOS and PMOS cross-coupled pairs replaced by NPN and PNP counterparts as shown in FIG. 24. There are no distinctions in the underlying principles of operation for CMOS and bipolar implementations. The circuit presented in this document employs both NMOS and PMOS cross-coupled pairs. However, designs that use only NMOS or PMOS cross-coupled pairs, as shown in FIG. 25, are considered as subsets of the proposed method.

Figure 26:
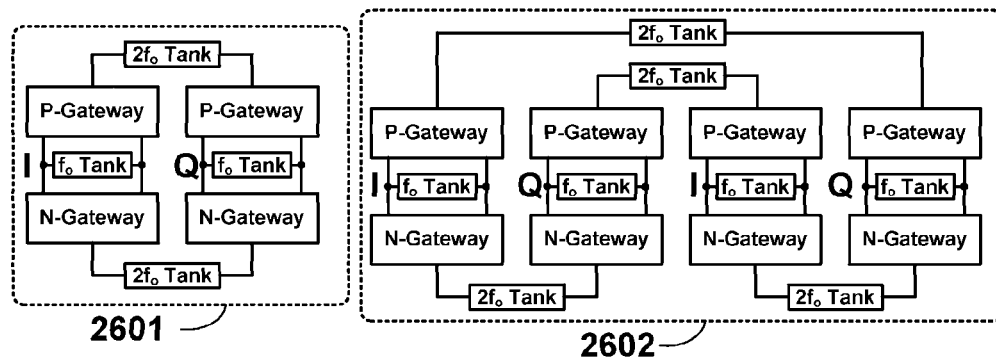
FIG. 26 shows a two-way (2601) and a four-way (2062) quadrature-phase oscillator configuration.
Figure 27:
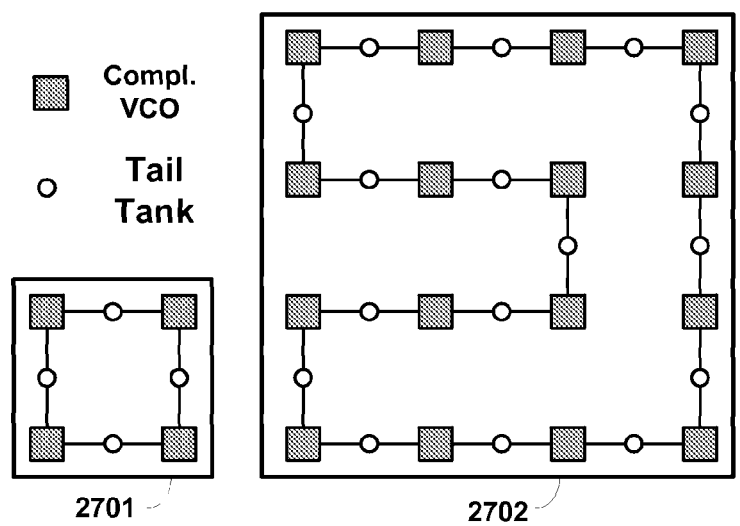
FIG. 27 shows a four-way (2701) and a sixteen-way (2702) configuration in a grid arrangement to ease quadrature clock distribution.

NMOS and PMOS cross-coupled pairs can be envisioned as bi-directional gateways that convert $f_o$ to $2f_o$ and $2f_o$ to $f_o$ and allow signal or noise current to flow between the differential output and the tail node. This concept can be used to combine any even number of LC tanks resonating at $f_o$ and $2f_o$ to form an integrated oscillator producing quadrature phase at frequency $f_{osc}$ and differential output at $2f_{osc}$. The resulting oscillator would have its phase noise lowered by 20 log(N/2) dB while power consumption is increased by N/2, where N is the number of main tanks combined. The noise factor and FOM remains the same, independent of N. FIG. 26 shows a two-way (2601) and a four-way (2602) configuration. Even though the phase noise reduction achieved is the same as a parallel combination of multiple QVCOs, this design eases the layout and the distribution of quadrature phase clocks to different areas of a large chip with little propagation delay, as long as the wires connecting the tail nodes and the tail tanks are nearly identical in layout. The $V_{ctrl}$ signal needs to be distributed to all copies of complementary VCOs, but this is not a problem because it is a low-frequency signal. The simplest realization of this idea is when complementary VCOs are distributed in a grid structure throughout the chip. FIG. 27 shows a four-way (2701) and a sixteen-way (2702) realization in a grid structure. The space not occupied by the oscillator would be filled by other circuits. The start-up circuit presented in earlier sections of this document can also be extended to support the multi-way quadrature phase oscillator to provide predictable output phases, as will be understood by one of ordinary skill in the art.

Although the present invention has been described in detail with respect to certain embodiments and examples, variations and modifications exist which are within the scope of the present invention as defined in the following claims.

What is claimed is:

1. A quadrature oscillator comprising: a first differential oscillator comprising a first LC resonator and a first cross-coupled pair with a first merged node; a second differential oscillator comprising a second LC resonator and a second cross-coupled pair with a second merged node; a third LC resonator connecting between said first merged node and said second merged node, wherein said third LC resonator is comprised of a first inductor with a first terminal and a second terminal, said first terminal is connected to said first merged node and said second terminal is connected to said second merged node; a second inductor having a third terminal and a fourth terminal, wherein said third terminal is connected to a center-tap of said first inductor, and said fourth terminal is connected to a ground or a voltage source; a third cross-coupled pair and a third merged node within said first differential oscillator; a fourth cross-coupled pair and a fourth merged node within said second differential oscillator; a fourth LC resonator connecting between said third merged node and said fourth merged node, wherein said fourth LC resonator is comprised of a third inductor with a fifth terminal and sixth terminal, said fifth terminal is connected to said third merged node and said sixth terminal is connected to said fourth merged node; and a fourth inductor with a seventh terminal and a eighth terminal, wherein said seventh terminal is connected to a center-tap of said third inductor, and said eighth terminal is connected to ground or a voltage source.

2. The quadrature oscillator of claim 1, wherein the resonating frequency of at least one of said third LC resonator and fourth LC resonator is approximately twice the resonating frequency of at least one of said first LC resonator and said second LC resonator.

3. The quadrature oscillator of claim 1, wherein the ratio between the capacitance of at least one of said third LC resonator and said fourth LC resonator to the capacitance of at least one of said first LC resonator and said second LC resonator is in the range of 0.25 to 1.

4. The quadrature oscillator of claim 1, wherein said first cross-coupled pair and said second cross-coupled pair are comprised of NPN transistors, and said third cross-coupled pair and said fourth cross-coupled pair are comprised of PNP transistors.

5. A quadrature oscillator comprising: a first differential oscillator comprising a first LC resonator and a first cross-coupled pair with a first merged node; a second differential oscillator comprising a second LC resonator and a second cross-coupled pair with a second merged node; a third LC resonator connecting between said first merged node and said second merged node, wherein said third LC resonator is comprised of a first simple self-inductance inductor with a first terminal and a second terminal, said first terminal is connected to said first merged node and said second terminal is connected to said second merged node, said first differential oscillator and said second differential oscillator inducing waveforms at approximately twice of said quadrature oscillator's oscillation frequency, wherein said third LC resonator stores energy due to said induced waveforms; and a second inductor having a third terminal and a fourth terminal, wherein said third terminal is connected to a center-tap of said first inductor, and said fourth terminal is connected to a ground or a voltage source.

6. The quadrature oscillator of claim 5, wherein the resonating frequency of said third LC resonator is approximately twice the resonating frequency of at least one of said first LC resonator and said second LC resonator.

7. The quadrature oscillator of claim 5, wherein the ratio between the capacitance of said third LC resonator to the capacitance of at least one of said first LC resonator and said second LC resonator is approximately 0.5.

8. The quadrature oscillator of claim 5, wherein said first cross-coupled pair and said second cross-coupled pair are comprised of NPN or PNP transistors.

9. A quadrature oscillator comprising: a first differential oscillator comprising a first LC resonator and a first cross-coupled pair with a first merged node; a second differential oscillator comprising a second LC resonator and a second cross-coupled pair with a second merged node; a third LC resonator connecting between said first merged node and said second merged node, wherein said third LC resonator is comprised of a first single turn inductor with a first terminal and a second terminal, said first terminal is connected to said first merged node and said second terminal is connected to said second merged node, said first differential oscillator and said second differential oscillator inducing waveforms at approximately twice of said quadrature oscillator's oscillation frequency, wherein said third LC resonator stores energy due to said induced waveforms; and a second inductor having a third terminal and a fourth terminal, wherein said third terminal is connected to a center-tap of said first single turn inductor, and said fourth terminal is connected to a ground or a voltage source.

10. The quadrature oscillator of claim 9, wherein said first LC resonator is comprised of a second single turn inductor and said second LC resonator is comprised of a third single turn inductor.

11. The quadrature oscillator of claim 9, wherein the resonating frequency of said third LC resonator is approximately twice the resonating frequency of at least one of said first LC resonator and said second LC resonator.

12. The quadrature oscillator of claim 9, wherein the ratio between the capacitance of said third LC resonator to the capacitance of at least one of said first LC resonator and said second LC resonator is approximately 0.5.

13. The quadrature oscillator of claim 9, wherein said first cross-coupled pair and said second cross-coupled pair are comprised of NPN or PNP transistors.

* * * * *